(12) United States Patent
Ikakura

(10) Patent No.: US 12,166,051 B2
(45) Date of Patent: Dec. 10, 2024

(54) PHOTOELECTRIC CONVERSION APPARATUS, METHOD OF MANUFACTURING THE SAME, AND IMAGE CAPTURING SYSTEM

(71) Applicant: CANON KABUSHIKI KAISHA, Tokyo (JP)

(72) Inventor: Hiroshi Ikakura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 593 days.

(21) Appl. No.: 17/388,743

(22) Filed: Jul. 29, 2021

(65) Prior Publication Data

US 2022/0037386 A1  Feb. 3, 2022

(30) Foreign Application Priority Data

Aug. 3, 2020  (JP) .................................. 2020-131484

(51) Int. Cl.
*H01L 27/146* (2006.01)
*B60R 11/04* (2006.01)

(52) U.S. Cl.
CPC .. *H01L 27/14621* (2013.01); *H01L 27/14627* (2013.01); *H01L 27/14645* (2013.01); *B60R 11/04* (2013.01)

(58) Field of Classification Search
CPC ......... H01L 27/14621; H01L 27/14627; H01L 27/14645; H01L 27/14634; H01L 27/1469; H01L 27/1463; H01L 27/1464; H01L 27/14641; H01L 27/14685; H01L 27/14605; H01L 27/14623; H01L 27/14629
See application file for complete search history.

(56) References Cited

U.S. PATENT DOCUMENTS

| | | | | |
|---|---|---|---|---|
| 2005/0236553 A1* | 10/2005 | Noto | ................. | H01L 27/14685 257/E31.128 |
| 2009/0166518 A1* | 7/2009 | Tay | ................... | H01L 27/14629 264/1.24 |
| 2016/0234446 A1* | 8/2016 | Numata | ................. | H04N 25/59 |
| 2019/0288026 A1* | 9/2019 | Von Kaenel | ........ | H01L 31/1844 |

(Continued)

FOREIGN PATENT DOCUMENTS

| | | |
|---|---|---|
| JP | 2003218343 A | 7/2003 |
| JP | 2005302884 A | 10/2005 |
| JP | 2007329721 A | 12/2007 |

(Continued)

*Primary Examiner* — Sitaramarao S Yechuri
(74) *Attorney, Agent, or Firm* — Canon U.S.A., Inc. IP Division

(57) ABSTRACT

An apparatus includes a substrate on which a pixel with a color filter is formed. The pixel includes a first conversion portion and a second conversion portion in an in-plane direction of the substrate, the second conversion portion having a lower sensitivity to light than a sensitivity of the first conversion portion. In a depth direction of the substrate, the apparatus includes a first member between the first conversion portion and the color filter and a second member between the second conversion portion and the color filter in a depth direction of the substrate. The first member is adjacent to the second member in the in-plane direction of the substrate. A refractive index of the first member is higher than a refractive index of the second member.

19 Claims, 25 Drawing Sheets

(56) References Cited

U.S. PATENT DOCUMENTS

2020/0404193 A1* 12/2020 Danilo Turchetta ..... H04N 5/32

FOREIGN PATENT DOCUMENTS

| JP | 2010278272 A | 12/2010 |
|----|--------------|---------|
| JP | 2015152738 A | 8/2015 |
| JP | 2016058754 A | 4/2016 |
| JP | 2016149407 A | 8/2016 |
| JP | 2017126898 A | 7/2017 |
| JP | 2018504013 A | 2/2018 |
| JP | 2018107357 A | 7/2018 |
| JP | 2019080305 A | 5/2019 |

* cited by examiner

- 3005 CONTACT PLUG
- 3004 CONTACT INTERLAYER INSULATION FILM
- 3003 TRANSISTOR
- 3002 STI DEVICE ISOLATION STRUCTURE
- 3001 SILICON SUBSTRATE

- 3103 Cu DIFFUSION PREVENTION FILM
- 3102 COPPER LINE
- 3101 INSULATION FILM

- 3206 BONDING METAL LAYER
- 3205 INSULATION FILM
- 3204 INSULATION FILM
- 3203 AL LINE
- 3202 TUNGSTEN PLUG
- 3201 INTERLAYER INSULATION FILM
- 3000 CIRCUIT SUBSTRATE

- 6004 CONTACT INTERLAYER INSULATION FILM
- 6005 CONTACT PLUG
- 6003 TRANSISTOR
- 6006 PHOTOELECTRIC CONVERSION PORTION C
- 6007 PHOTOELECTRIC CONVERSION PORTION D
- 6002 STI DEVICE ISOLATION STRUCTURE
- 6001 SILICON SUBSTRATE

- 6103 Cu DIFFUSION PREVENTION FILM
- 6102 COPPER LINE
- 6101 INSULATION FILM

- 6205 INSULATION FILM
- 6206 BONDING METAL LAYER
- 6204 INSULATION FILM
- 6203 AL LINE
- 6202 TUNGSTEN PLUG
- 6201 INTERLAYER INSULATION FILM

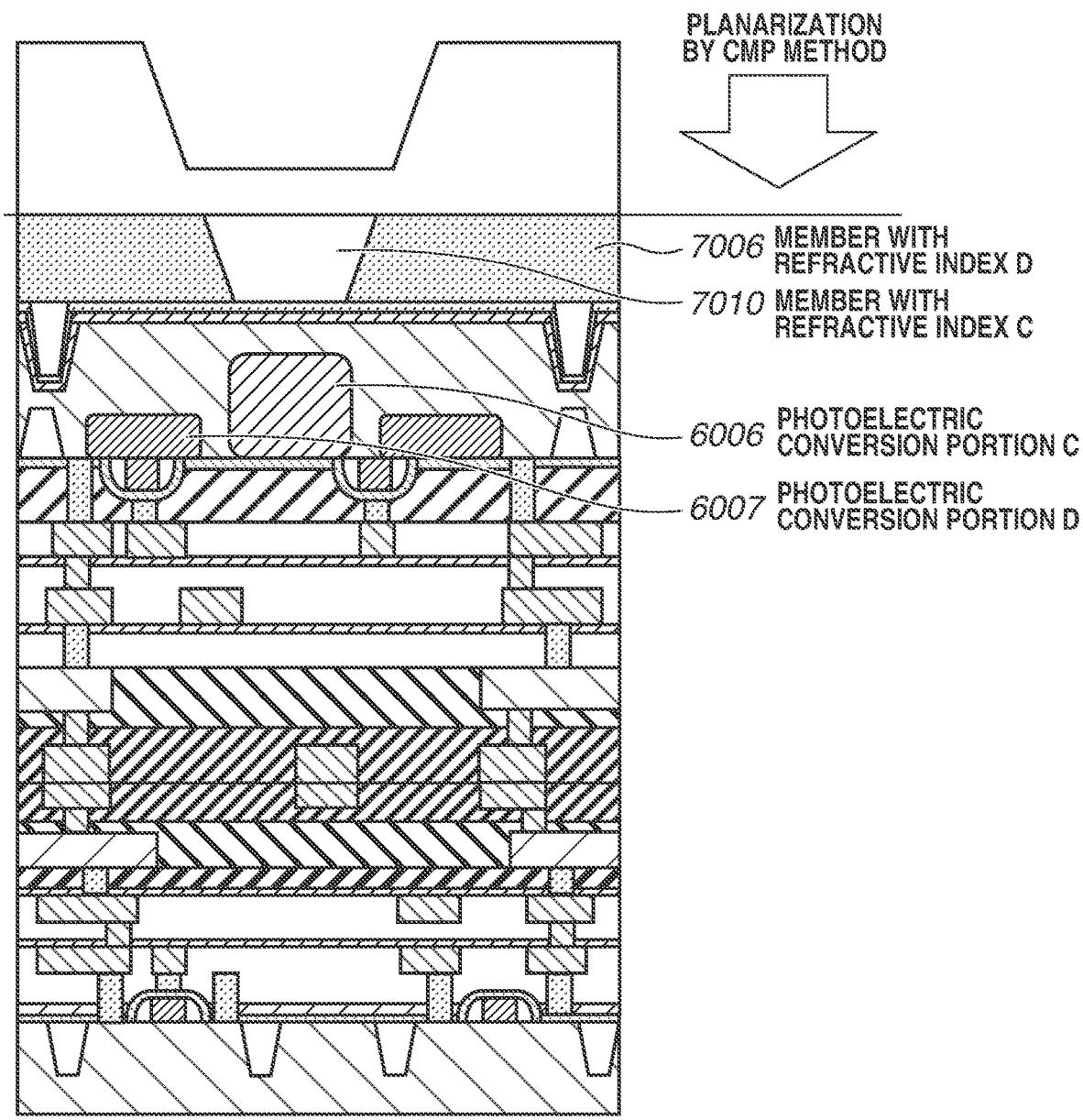

PHOTOELECTRIC CONVERSION APPARATUS, METHOD OF MANUFACTURING THE SAME, AND IMAGE CAPTURING SYSTEM

BACKGROUND OF THE DISCLOSURE

Field of the Disclosure

The aspect of the embodiments relates to photoelectric conversion apparatuses, a method of manufacturing the same, and image capturing systems.

Description of the Related Art

In recent years, photoelectric conversion apparatuses (photosensors) with a wide dynamic range have been in demand Conventional photosensors cannot support capturing images of dark and bright portions simultaneously, but the apparatus with a high dynamic range can do, which is suitable to scenes with large differences in the contrast due, for example, to backlight in an in-vehicle camera or a security camera.

To achieve a high dynamic range, there is used a method of increasing a dynamic range by combining two or more photodiodes having different characteristics.

Conventional photosensors can have a high dynamic range with their improved characteristics. Japanese Patent Application Laid-Open No. 2003-218343 discusses a method of achieving a high dynamic range by combining a plurality of photodiodes with different sensitivities using an area difference between the photodiodes, as a conventional technique. Japanese Patent Application Laid-Open No. 2007-329721 discusses another method of providing a plurality of photodiodes with different sensitivities each photodiode of which a light reduction filter with a transmittance different from one another is formed over. There is a method of combining a plurality of photodiodes with different sensitivities by arranging the photodiodes in a cascade structure as discussed in United States Patent Publication Application No. 2018/0269245. Further, United States Patent Publication Application No. 2019/0131333 discusses a high-sensitivity pixel with an overflow drain (OFD) circuit added thereto to prepare for the condition that a high-sensitivity pixel is filled with charge by intense light.

The sensitivity difference between the photodiodes of the conventional photosensors is not sufficient.

SUMMARY OF THE DISCLOSURE

According to an aspect of the embodiments, a photoelectric conversion apparatus includes a substrate on which a pixel with a color filter is formed. The pixel includes a first photoelectric conversion portion and a second photoelectric conversion portion in an in-plane direction of the substrate, the second photoelectric conversion portion having a lower sensitivity to light than a sensitivity of the first photoelectric conversion portion. In a depth direction of the substrate, the photoelectric conversion apparatus includes a first member between the first photoelectric conversion portion and the color filter and a second member between the second photoelectric conversion portion and the color filter. The first member is adjacent to the second member in the in-plane direction of the substrate. A refractive index of the first member is higher than a refractive index of the second member.

According to another aspect of the embodiments, a photoelectric conversion apparatus includes a substrate including a pixel. The pixel includes a first photoelectric conversion portion and a second photoelectric conversion portion in an in-plane direction of the substrate, the second photoelectric conversion portion having a lower sensitivity to light than a sensitivity of the first photoelectric conversion portion. The photoelectric conversion apparatus includes an overflow transistor to discharge excessive charge of the first photoelectric conversion portion. In a depth direction of the substrate, the photoelectric conversion apparatus includes a first member nearer a light incidence side of the first photoelectric conversion portion and a second member nearer a light incidence side of the second photoelectric conversion portion. The first member is adjacent to the second member in the in-plane direction of the substrate. A refractive index of the first member is higher than a refractive index of the second member.

According to yet another aspect of the disclosure, a photoelectric conversion apparatus includes a substrate including a pixel. The pixel includes a first photoelectric conversion portion of a first conductivity type and a second photoelectric conversion portion of the first conductivity type having a lower impurity concentration than an impurity concentration in the first photoelectric conversion portion of the first conductivity type, the first photoelectric conversion portion and the second photoelectric conversion portion being in an in-plane direction of the substrate. In a depth direction of the substrate, a first member is nearer a light incidence side of the first photoelectric conversion portion and a second member is nearer a light incidence side of the second photoelectric conversion portion. The first member is adjacent to the second member in the in-plane direction of the substrate. A refractive index of the first member is higher than a refractive index of the second member.

According to yet another aspect of the embodiments, a photoelectric conversion apparatus includes a substrate on which a pixel with a color filter is formed. The pixel includes a first photoelectric conversion portion and a second photoelectric conversion portion in an in-plane direction of the substrate, the second photoelectric conversion portion having a lower sensitivity to light than a sensitivity of the first photoelectric conversion portion. The first photoelectric conversion portion and the second photoelectric conversion portion are in a first plane parallel to a light incidence surface of the substrate. A first member overlapping the first photoelectric conversion portion and a second member overlapping the second photoelectric conversion portion are adjacent to each other in a second plane parallel to the light incidence surface of the substrate. The first member and the second member are under the color filter. A refractive index of the first member is higher than a refractive index of the second member.

According to yet another aspect of the embodiments, a method of manufacturing a photoelectric conversion apparatus including a color filter includes forming a first semiconductor region and a second semiconductor region, the first semiconductor region constituting a photoelectric conversion portion, and forming a first member between a light incidence surface side of the first semiconductor region and a part of the color filter and a second member between a light incidence surface side of the second semiconductor region and a part of the color filter. The first member and the second member are adjacent to each other. A refractive index of the first member and a refractive index of the second member are different from each other.

Further features of the disclosure will become apparent from the following description of exemplary embodiments with reference to the attached drawings.

BRIEF DESCRIPTION OF THE DRAWINGS

FIG. 10C illustrates a schematic cross-sectional structure as an example of a method of manufacturing a photoelectric conversion apparatus according to the second exemplary embodiment.

DESCRIPTION OF THE EMBODIMENTS

Figure 1:
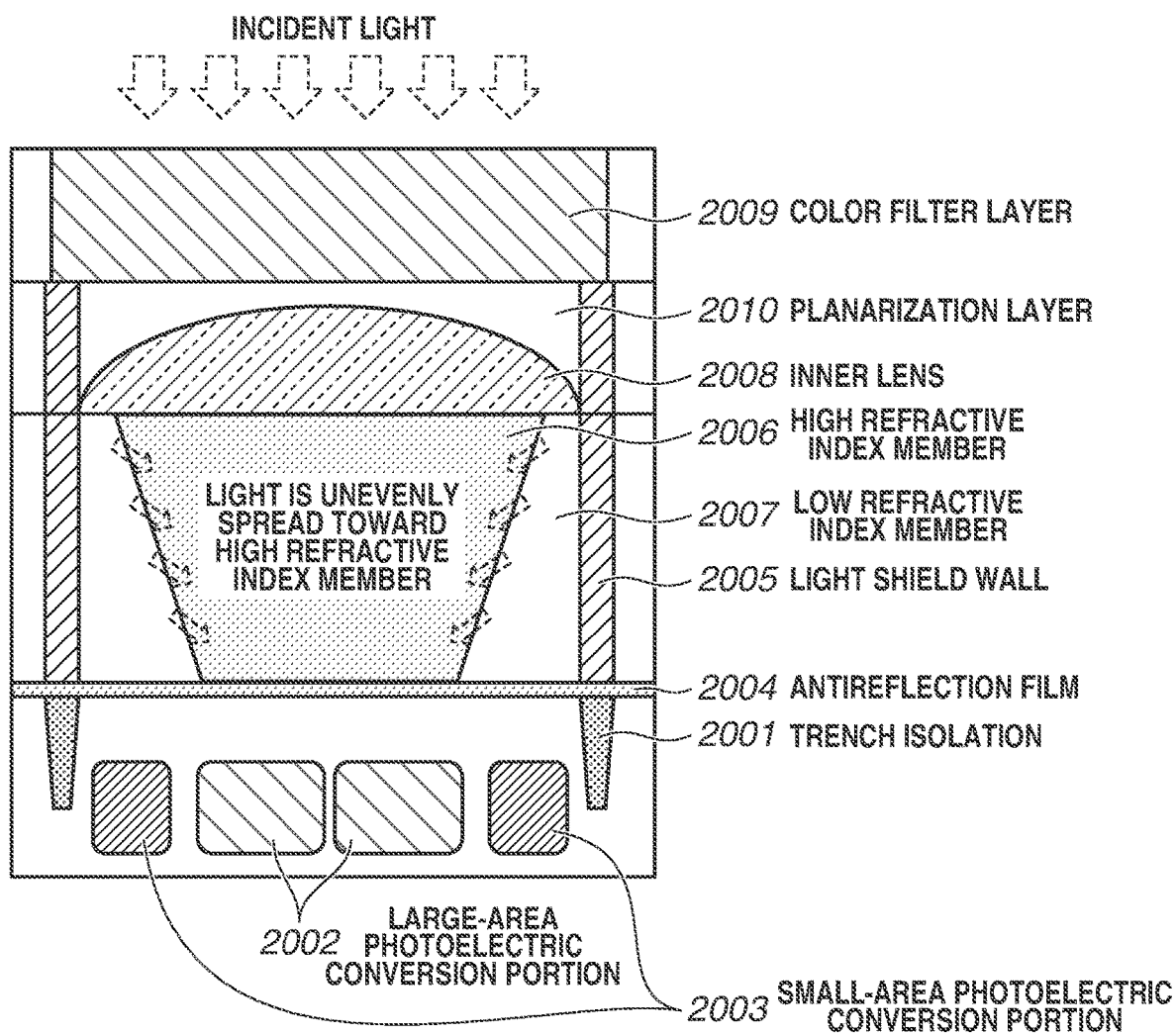
FIG. 1 illustrates a schematic cross-sectional structure of a pixel of a photoelectric conversion apparatus according to a first exemplary embodiment.
Figure 2:
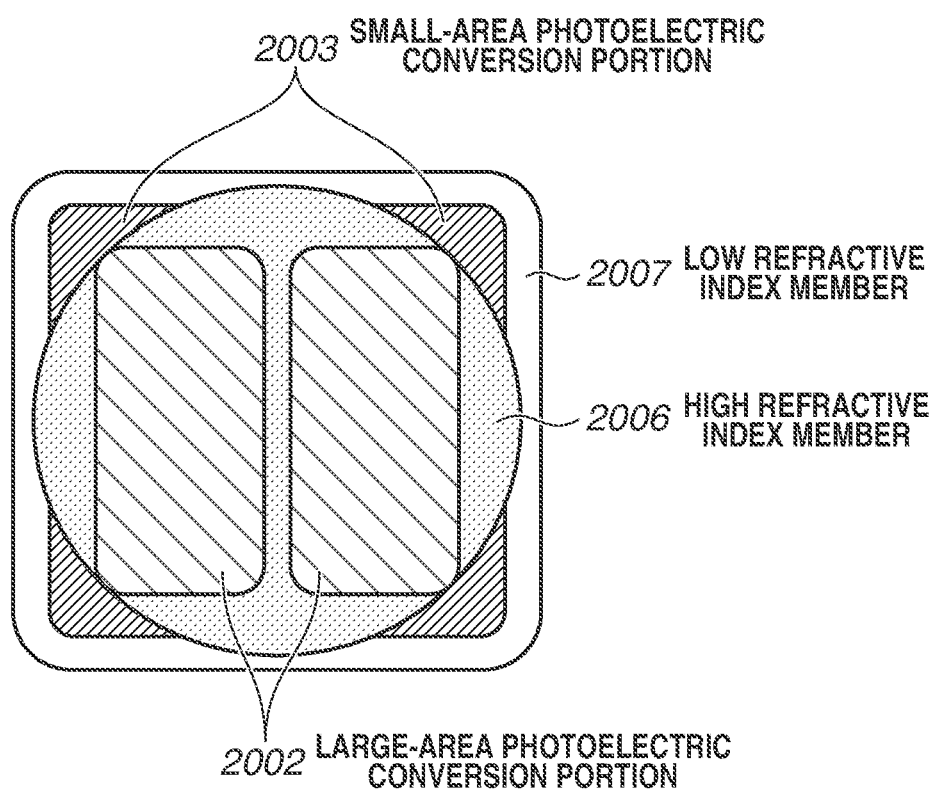
FIG. 2 illustrates a schematic planar structure of the pixel of the photoelectric conversion apparatus according to the first exemplary embodiment.

An example of an exemplary embodiment of the disclosure will be described with reference to FIGS. 1 and 2. FIG. 1 illustrates a schematic cross-sectional structure of a pixel of a photoelectric conversion apparatus according to the present exemplary embodiment, and FIG. 2 illustrates a schematic planar structure of the pixel of the photoelectric conversion apparatus according to the present exemplary embodiment.

A structure of the pixel illustrated in FIG. 1 will be described. The pixel illustrated in FIG. 1 includes a trench isolation 2001, large-area photoelectric conversion portions (large photodiode (large PD)) 2002, and small-area photoelectric conversion portions (small photodiode (small PD)) 2003. The area of a small PD 2003 is smaller than that of a large PD 2002. The pixel further includes an antireflection film 2004, a light shield wall 2005, a high refractive index member 2006, a low refractive index member 2007, an inner lens 2008, and a color filter layer 2009. The refractive index of the low refractive index member 2007 is lower than that of the high refractive index member 2006. The large PDs 2002 and the small PDs 2003 are adjacent to one another in the in-plane direction (direction parallel to the sheet of FIG. 2) of the substrate.

The large PDs 2002 and the small PDs 2003 formed in the pixel each may not be a single photodiode and can include a combination of them. In this case, the area of the large PDs 2002 is the total area of photoelectric conversion portions of the photodiodes of the large PDs 2002, and that holds true for the area of the small PDs 2003.

FIG. 1 illustrates an example of two types of photodiodes as large PDs 2002 and four photodiodes as small PDs 2003.

The high refractive index member 2006 has a relatively high refractive index and is formed overlapping the large PDs 2002 nearer the light incidence surface of the whole pixel. The low refractive index member 2007 has a relatively low refractive index and is formed overlapping the small PDs 2003 nearer the light incidence surface of the whole pixel. The light to enter the photoelectric conversion portions has passed through at least the high refractive index member 2006 or the low refractive index member 2007. In other words, assuming that there are a first plane and a second plane as virtual planes, the large PDs 2002 and the small PDs 2003 are arranged in the first plane, and the high refractive index member 2006 and the low refractive index member 2007 are arranged in the second plane, which is nearer the light incidence surface than the first plane.

The inner lens 2008 is formed overlapping the large PDs 2002 and the small PDs 2003 nearer the light incidence surface of the pixel. The inner lens 2008 is disposed to converge light as appropriate.

The light shield wall 2005 prevents incident light from interfering with the adjacent pixels.

The trench isolation 2001 isolates the photoelectric conversion portions of the pixel from the photoelectric conversion portions of the adjacent pixels in the semiconductor substrate to prevent the interference of accumulated charge.

The color filter layer 2009 is formed on a planarization layer 2010 over the inner lens 2008 to cover the high refractive index member 2006 and the low refractive index member 2007. One color filter layer 2009 covers both the high refractive index member 2006 and the low refractive index member 2007. Thus, at least part of the projected area of the color filter layer 2009 overlaps the light incident surfaces of the large PDs 2002 and the small PDs 2003. The color filter layer 2009 allows the light of the particular wavelength range (red light, green light, or blue light) corresponding to the type of the color filter layer 2009 to enter the photoelectric conversion portions in the pixel.

A microlens to guide incident light to photoelectric conversion portions, for example, is disposed to cover both the large PDs 2002 and the small PDs 2003, allowing at least part of the projected area of the microlens to overlap the light incidence surfaces of the large PDs 2002 and the small PDs 2003. At least part of the projected area of the microlens overlaps the high refractive index member 2006 and the low refractive index member 2007, which are over the large PDs 2002 and the small PDs 2003. The structure of the microlens is not limited to the above-described example and one or more microlenses are applicable.

A relationship between the photoelectric conversion portions and the refractive indexes of the members disposed over the photoelectric conversion portions in FIG. 1 will be described.

FIG. 2 is a plane view illustrating the positional relationship between the photoelectric conversion portions and the members over the photoelectric conversion portions in the photoelectric conversion apparatus illustrated in FIG. 1. The back side in the direction perpendicular to the sheet is the light incidence surface. The small PDs 2003 are on the periphery of the pixel and the large PDs 2002 nested inside the small PDs 2003 are at the center of the pixel. As described above, the high refractive index member 2006 is disposed nearer the light incidence surfaces of the large PDs 2002, and the low refractive index member 2007 is disposed nearer the light incidence surfaces of the small PDs 2003, adjacently to the high refractive index member 2006.

Light incident on the pixel passes through the high refractive index member 2006 and the low refractive index member 2007. With different refractive indexes of two members in contact with each other similar to the arrangement of the high refractive index member 2006 and the low refractive index member 2007, incident light concentrates on one member of the higher refractive index; the quantity of light incident on the other member of the lower refractive index is low as compared with the case where neither of the members are present. The nest structure, in which the high refractive index member 2006 is surrounded by the low refractive index member 2007, offers a larger area defined as a contact area between the high refractive index member 2006 and the low refractive index member 2007 in contact with each other, providing an efficient collection of incident light.

Light incident on the high refractive index member 2006 and the low refractive index member 2007 in the pixel enters the photoelectric conversion portions of the large PDs 2002 and the small PDs 2003 in proportion to the area ratio between the large PDs 2002 and the small PDs 2003.

Thus, the quantity of light incident on the small PDs 2003 under the low refractive index member 2007 is less than the quantity of incident light determined in proportion to the area ratio between the large PDs 2002 and the small PDs 2003.

On the other hand, the large PDs 2002 each have a large area to efficiently gather incident light, and the incident light is concentrated by the high refractive index member 2006, causing the quantity of light incident on the large PDs 2002 to be greater than the quantity of incident light determined in proportion to the area ratio between the large PDs 2002 and the small PDs 2003.

The positional relationship between the large PDs 2002 and the small PDs 2003 is not limited as long as they are disposed in a pixel, and the reverse of the positional relationship from that illustrated in the drawings is applicable as long as the magnitude of refractive index relationship of both types of the members and the magnitude of area relationship of both types of PD are maintained. The sensitivity ratio between both types of PDs in a pixel and the refractive index ratio between both members are to be determined within a range in which the small PDs 2003 can output a signal higher than a noise level before the output signal of the large PD 2002 is saturated, and this also applies to the cases in the following second to fourth exemplary embodiments.

Two members with different refractive indexes from each other each may be made of a dielectric substance, and a combination of $SiO_2$ with a refractive index of 1.46 and SiN with a refractive index of 2.00 is usable as an example, but the materials of the members are not limited to those described above, and any materials with different refractive indexes from each other are usable.

The structure in which the high refractive index member 2006 and the low refractive index member 2007, those refractive indexes of which are different from each other, are disposed nearer the light incidence surface as described above allows the large PDs 2002 to have a higher sensitivity and the small PDs 2003 to have a lower sensitivity, increasing the sensitivity difference between the large and small photoelectric conversion portions, providing a wider dynamic range to the pixel.

Thus, the structure has a higher sensitivity difference between the photodiodes with different sensitivities from each other in one pixel. This provides a photosensor with a higher dynamic range than that of a conventional photosensor at the same pixel pitch as that of the conventional photosensor.

A second exemplary embodiment will be described with reference to FIGS. 3 and 4.

In the present exemplary embodiment, a dynamic range characteristic based on an impurity concentration difference between photoelectric conversion portions is enlarged by a high refractive index member and a low refractive index member formed over the photoelectric conversion portions.

Figure 3:
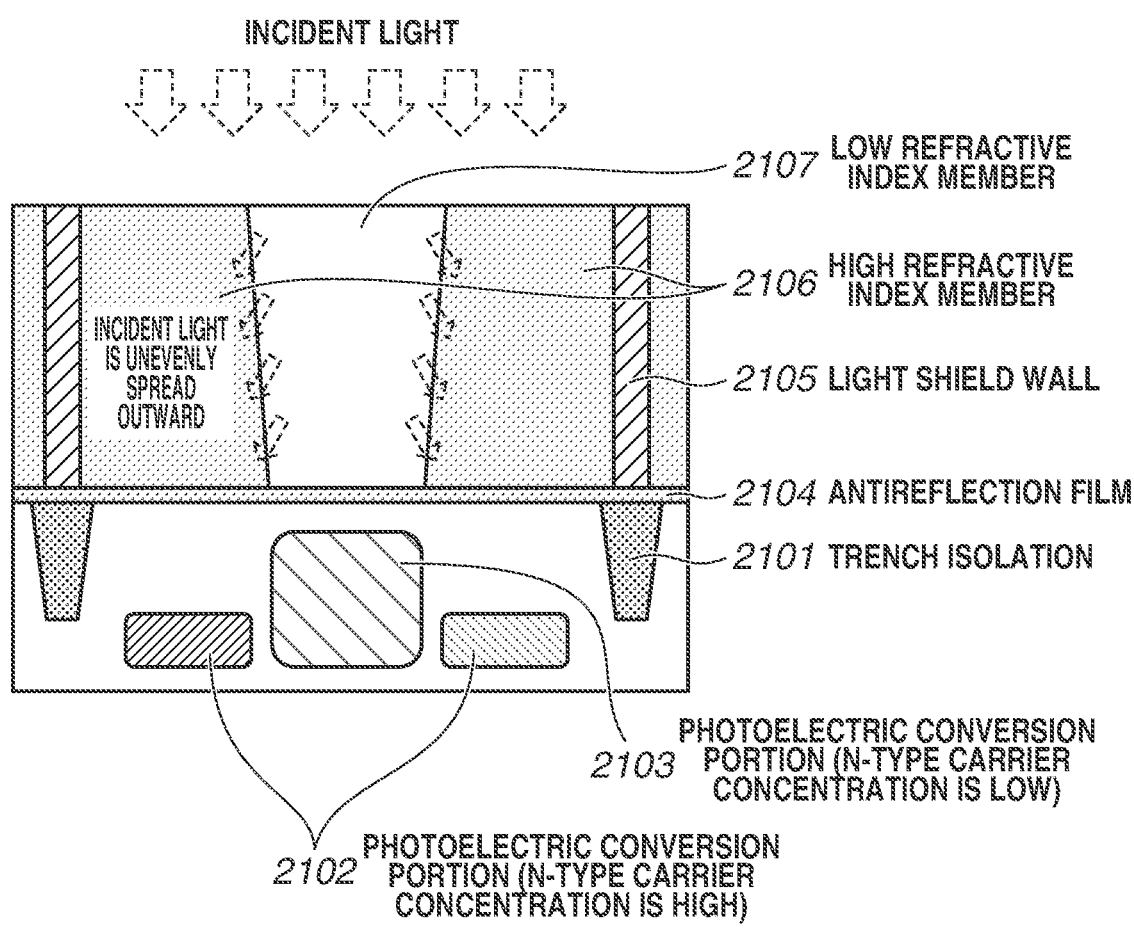
FIG. 3 illustrates a schematic cross-sectional structure of a pixel of a photoelectric conversion apparatus according to a second exemplary embodiment.
Figure 4:
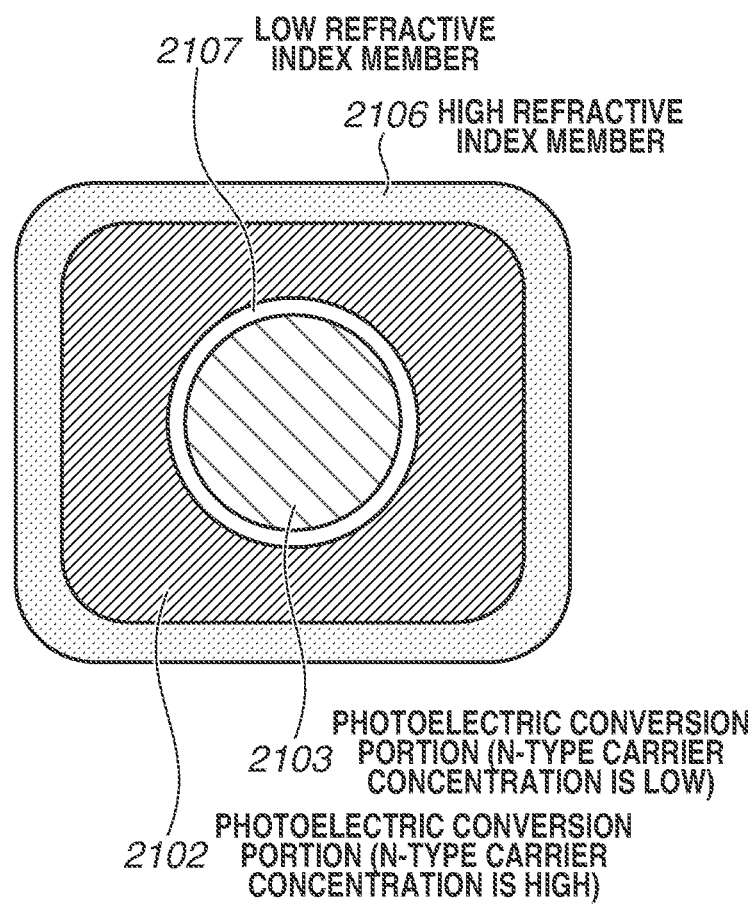
FIG. 4 illustrates a schematic planar structure of the pixel of the photoelectric conversion apparatus according to the second exemplary embodiment.

FIG. 3 illustrates a schematic cross-sectional structure of a pixel of a photoelectric conversion apparatus according to the present exemplary embodiment, and FIG. 4 illustrates a schematic planar structure of the pixel of the photoelectric conversion apparatus according to the present exemplary embodiment. Redundant descriptions of those described in the first exemplary embodiment will be omitted, and mainly differences from the first exemplary embodiment will be described.

The pixel illustrated in FIG. 3 includes a trench isolation 2101, a high concentration photoelectric conversion portion (high-concentration PD) 2102, a low concentration photoelectric conversion portion (low-concentration PD) 2103, an antireflection film 2104, a light shield wall 2105, a high refractive index member 2106, and a low refractive index member 2107 as illustrated in FIG. 3.

The pixel includes the high-concentration PD 2102 including a semiconductor region with a relatively high impurity concentration and the low-concentration PD 2103 that is the same conductivity type as the high-concentration PD 2102 and that includes a semiconductor region with a relatively low impurity concentration.

The high refractive index member 2106 has a relatively high refractive index and is formed nearer the light incidence surface of the whole pixel overlapping the high-concentration PD 2102. The low refractive index member 2107 has a relatively low refractive index and is formed nearer the light incidence surface of the whole pixel overlapping the low-concentration PD 2103.

In other words, assuming that there are a first plane and a second plane as virtual planes, the high-concentration PD 2102 and the low concentration PD 2103 are arranged in the first plane, and the high refractive index member 2006 and the low refractive index member 2007 are arranged in the second plane, which is nearer the light incidence surface than the first plane.

The light shield wall 2005 prevents incident light from interfering with the adjacent pixels.

The trench isolation 2101 isolates the photoelectric conversion portions from the photoelectric conversion portions of the adjacent pixels in the semiconductor substrate to prevent interference of accumulated charge.

A relationship between the impurity concentration difference between two types of photoelectric conversion portions (the high-concentration PD 2102 and the low-concentration PD 2103) and the refractive index difference between two types of refractive index members disposed over the photoelectric conversion portions in FIG. 3 will be described.

FIG. 4 is a plan view illustrating a positional relationship between the photoelectric conversion portions 2102 and 2103 of the photoelectric conversion apparatus and the refractive index members 2106 and 2107 disposed over the photoelectric conversion portions 2102 and 2103 in FIG. 3, respectively. As described above, the high refractive index member 2106 is disposed nearer the light incidence surface of the high-concentration PD 2102, and the low refractive index member 2107, adjacent to the high refractive index member 2106, is disposed nearer the light incidence surface of the low-concentration PD 2103.

Light incident on the pixel passes through the high refractive index member 2106 and the low refractive index member 2107. With the different refractive indexes of two members in contact with each other similar to the arrangement of the high refractive index member 2106 and the low refractive index member 2107, incident light concentrates on one member of the higher refractive index; the quantity of light incident on the other member of the lower refractive index is low.

Light incident on the pixel enters the high-concentration PD 2102 and the low-concentration PD 2103 through the high refractive index member 2106 and the low refractive index member 2107.

The quantity of light incident on the low-concentration PD 2103 under the low refractive index member 2107 is low compared with the quantity of light incident on the low-concentration PD 2103 with neither of the members present. Similarly, the quantity of light incident on the high-concentration PD 2102 through the light gathering by the high refractive index member 2106 is high compared with the quantity of light incident on the high-concentration PD 2102 with neither of the members present.

In addition, the high concentration PD 2102 with a higher impurity concentration than that of the low-concentration PD 2103 can hold more charge. In the present exemplary embodiment, the difference between the quantity of light incident on the high-concentration PD 2102 and the quantity of light incident on the low-concentration PD 2103 allows the difference between the amount of charge held by the high-concentration PD 2102 and the amount of charge held by the low-concentration PD 2103 to be wider than the difference in the amount of saturated charge determined in proportion to the impurity concentration ratio between the high-concentration PD 2102 and the low-concentration PD 2103.

The positional relationship between the high-concentration PD 2102 and the low-concentration PD 2103 is not limited as long as they are disposed in a pixel, and the reverse of the positional relationship from that illustrated in the drawing is applicable as long as the magnitude of refractive index relationship of both types of the members and the impurity concentration relationship of both types of PD are maintained.

The structure with the members with different refractive indexes from each other disposed nearer the light incidence surface allows more light to be concentrated on the high-concentration PD 2102, which can hold more charge, and less light to enter the low-concentration PD 2103, which can hold a smaller amount of charge. This allows the high-concentration PD 2102 and the low-concentration PD 2103 to be resistant to being saturated, offering a wider sensitivity difference between the photoelectric conversion portions of the high-concentration PD 2102 and the low-concentration PD 2103.

As a result, this provides an efficient arrangement of the photodiodes with different sensitivities from each other in a single pixel, and a sensor having a higher dynamic range at the same pixel pitch as that of a conventional photosensor.

(Example of First Exemplary Embodiment)

Next, an example of the first exemplary embodiment will be described with reference to the circuit diagram illustrated in FIG. 5.

Figure 5:
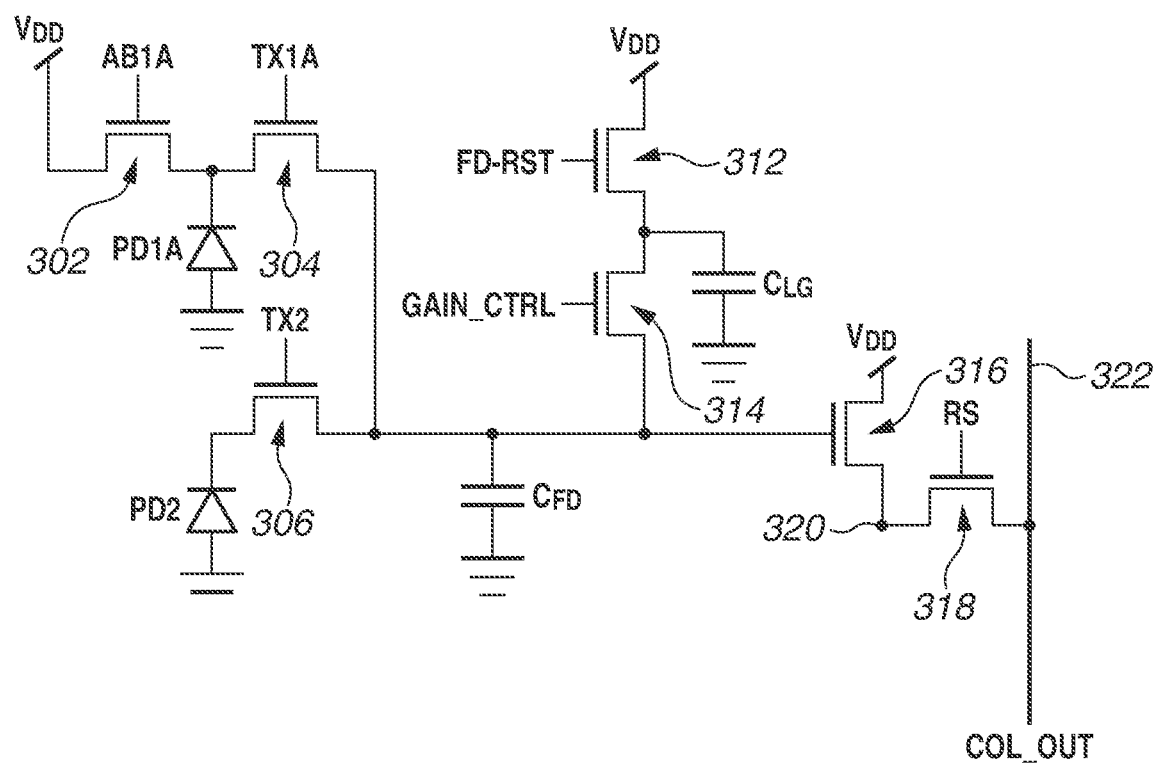
FIG. 5 illustrates an example of a pixel circuit of the photoelectric conversion apparatus according to the first exemplary embodiment.

FIG. 5 illustrates an example of a high dynamic range characteristic provided based on a principle different from those in FIGS. 1 and 3.

FIG. 5 illustrates an equivalent circuit of a pixel circuit according to the present exemplary embodiment. A configuration thereof will be described.

The pixel circuit illustrated in FIG. 5 includes a first photodiode PD1, a second photodiode PD2, transfer switches 304 and 306, an overflow transistor 302, a floating diffusion (FD) capacitor CFD, a gain control switch 314, a capacitor C1g, a reset switch 312, a source follower transistor 316, and a select switch 318.

The following is a description of the functions and connections of the components.

The first photodiode PD1 and the second photodiode PD2 each are an example of a photoelectric conversion portion. Light incident on the first photodiode PD1 and the second photodiode PD2 generates charge through photoelectric conversion. The first photodiode PD1 and the second photodiode PD2 each accumulate the generated charge as a signal charge.

the source of the transfer switch 304 and the cathode of the first photodiode PD1 are electrically joined together, and the drain of the transfer switch 304 and the input node (gate) of the source follower transistor 316 are electrically joined together. The source of the transfer switch 306 and the cathode of the second photodiode PD2 are electrically joined together, and the drain of the transfer switch 306 and the input node of the source follower transistor 316 are electrically joined together.

A control signal TX1A is input to the gate of the transfer switch 304, and a control signal TX2 is input to the gate of the transfer switch 306. With the control signals TX1A and TX2 at high level, the signal charges of the first photodiode PD1 and the second photodiode PD2 are transferred to the input node of the source follower transistor 316.

The drain of the overflow transistor 302 is connected to a power source VDD. The source of the overflow transistor 302 is connected to the cathode of the first photodiode PD1. A control signal AB1A is input to the gate of the overflow transistor 302. In the overflow transistor 302, a potential barrier corresponding to the gate potential is formed. With a control signal OF at high level, the signal charge of the first photodiode PD1 is transferred to the power source VDD. With the control signal AB1A at an intermediate potential LM1 (low<LM1<high), the potential barrier between the power source VDD and the first photodiode PD1 is at a lower level than the barriers of the other regions, allowing the excessive charge to be discharged to the power source VDD.

The drains of transfer switches TX1A and TX2, the source of the gain control switch 314, and the gate of the source follower transistor 316 are connected together to form one node. This node may be referred to as a FD node or a FD portion. In FIG. 5, the capacitor of the FD portion is written as the FD capacitor CFD. The FD capacitor CFD can contain a parasitic capacitance of a line of the FD portion and a parasitic capacitance of the gate of a transistor connected to the FD portion. Further, the FD capacitor CFD may have a PN-junction capacitance of a semiconductor region of the FD portion and a PN-junction capacitance of the source or drain of a transistor connected to the FD portion. In addition to the foregoing capacitors, the FD capacitor CFD can constitute a capacitor such as a poly-insulator-poly (PIP) capacitor, a metal-insulator-metal (MIM) capacitor, or a metal-oxide-semiconductor (MOS) capacitor. In one or more examples, with these capacitors described above provided, one end of the capacitor is connected to the drains of the transfer switches TX1A and TX2, the source of the gain control switch 314, and the gate of the source follower transistor 316.

The drain of a gain control switch MGC is connected to one terminal of the capacitor C1g and the source of a reset switch MRES. A control signal GC is input to the gate of the gain control switch MGC. With charge accumulated in the capacitor C1g, the control signal GC is changed to low level and the gain control switch MGC is turned off, isolating the capacitor C1g from the FD capacitor CFD. Further, as the gain control switch MGC is switched between on and off according to switches of the control signal GC between high and low, the capacitor C1g is or is not as a part of the FD capacitor, affecting the gain of a charge voltage converter. Furthermore, with the control signal GC at an intermediate potential LM1 (low<LM1<high), the potential barrier between the capacitor C1g and the second photodiode PD2 is at a lower level than the barriers of the other regions, allowing the excessive charge to be discharged to the capacitor C1g.

The drain of the reset switch 312 and the drain of the source follower transistor 316 are connected to the power source VDD. A control signal FD-RST is input to the gate of the reset switch 312. The control signal FD-RST at high level causes the reset switch 312 to be turned on, resetting the first photodiode PD1, the second photodiode PD2, the FD portion, and the capacitor C1g partially or all.

The source of the source follower transistor 316 is connected to a vertical output line 322 via the select switch 318. A control signal RS is input to the gate of the select switch 318. The control signal RS at high level causes the select switch 318 to be turned on, forming a source follower circuit of the source follower transistor 316 and a current source.

The anode of the first photodiode PD1 and the anode of the second photodiode PD2 are each connected to the ground potential. Further, the FD capacitor CFD and the other terminal of the capacitor C1g are each connected to the ground potential.

The second photodiode PD2 has a region with a potential that is low for the electrons as the signal charge, and has a potential barrier for the signal charge around the region. Specifically, the cathode of the second photodiode PD2 has a region with a locally high potential. Thus, the generated signal charge is accumulated in the cathode of the second photodiode PD2. As electrons as the signal charge are accumulated, the potential of the cathode of the second photodiode PD2 decreases. Consequently, the height of the potential barrier formed around the second photodiode PD2 decreases.

Excessive charge may be generated by photoelectric conversion beyond the amount of charge that can be accumulated in a photodiode. Excessive charge generated by a large quantity of light incident on the second photodiode PD2 overflow from the lowest part of the potential barrier to the outside.

The transfer switch 306 is situated between the second photodiode PD2 and the FD portion, and the gain control switch 314 is situated between the FD portion and the capacitor C1g. The height of the potential barrier of the region that is immediately below the gate of the transfer switch 306, i.e., the channel region of the transfer switch 306, is controllable with a gate potential TX2 of the transfer switch 306. Similarly, the height of the potential barrier of the region that is immediately below the gain control switch 314, i.e., the channel region of the gain control switch 314, is controllable with a gate potential GAIN_CTRL of the gain control switch 314.

The control signal TX2 of the transfer switch 306 is controlled so that the potential barrier between the second photodiode PD2 and the FD portion becomes lowest in the potential barrier around the second photodiode PD2. In this case, the excessive charge generated in the second photodiode PD2 is discharged through the transfer switch 306. With the gain control switch 314 set to off, the discharged excessive charge is held by the FD portion. The on/off control on the gain control switch 314 is performed with the control signal GAIN_CTRL input to the gain control switch 314. With the gain control switch 314 set to on, the discharged excessive charges are held by the FD portion and the capacitor C1g.

With the above-described pixel circuit, three types of signals can be read: a signal based on the charge accumulated in the first photodiode PD1, a signal based on the charge accumulated in the second photodiode PD2, and a signal based on the charge that overflows from the second photodiode PD2 and that is accumulated in the FD portion and the capacitor C1g. The dynamic range is enlarged by reading the three types of signals.

A relationship between the photoelectric conversion portions and refractive indexes of the members disposed over the photoelectric conversion portions will be described.

In the present exemplary embodiment, a high refractive index member is disposed nearer the light incidence surface of the first photodiode PD1, and a low refractive index member, adjacently to the high refractive index member, is disposed nearer the light incidence surface of the second photodiode PD2. The area of the first photodiode PD1 is larger than that of the second photodiode PD2.

As described above, light incident on the pixel is concentrated on one of the photoelectric conversion portions due to the refractive index difference between the high refractive index member and the low refractive index member.

Thus, the quantity of light incident on the second photodiode PD2 disposed under the low refractive index member is less than the quantity of incident light determined in proportion to the area ratio between the first photodiode PD1 and the second photodiode PD2. On the other hand, the quantity of light incident on the first photodiode PD1 disposed under the high refractive index member is greater than the quantity of incident light determined in proportion to the area ratio between the first photodiode PD1 and the second photodiode PD2.

The structure with the members with different refractive indexes from each other disposed nearer the light incidence surfaces of the first photodiode PD1 and the second photodiode PD2, respectively, offers a wider sensitivity difference between the photoelectric conversion portions, accommodating a broader range of the light corresponding to each of the three types of signals according to the present exemplary embodiment. Thus, this structure has a high sensitivity ratio between photodiodes with different sensitivities from each other in a single pixel. This provides a photosensor with a higher dynamic range at the same pixel pitch as that of a conventional photosensor.

While the example of the first exemplary embodiment is described above, the applications of the present exemplary embodiment are not limited to the first exemplary embodiment, and the sensitivity difference between the photoelectric conversion portions can be increased using the circuit illustrated in FIG. 5 in the second exemplary embodiment.

(First Manufacturing Method)

A method of manufacturing a photoelectric conversion apparatus according to the first exemplary embodiment will be described.

The following is a manufacturing method of manufacturing a photoelectric conversion apparatus by bonding a manufactured circuit substrate and a manufactured photodiode substrate together.

First, a circuit substrate with a peripheral circuit formed thereon will be manufactured.

Figure 6A:
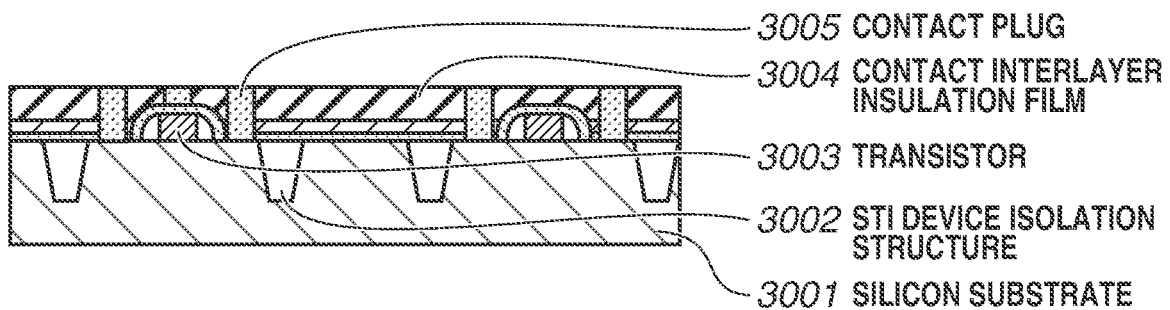
FIGS. 6A to 6C illustrate schematic cross-sectional structures as an example of a method of manufacturing a photoelectric conversion apparatus according to the first exemplary embodiment.

The formation of silicon semiconductor devices and contact plugs 3005 will be described with reference to FIG. 6A.

First, silicon semiconductor devices such as transistors 3003 are formed on a silicon substrate 3001. The devices are isolated from one another by STI device isolation structures 3002. After that, a contact interlayer insulation film 3004 is deposited by a chemical vapor deposition (CVD) method, and the contact interlayer insulation film 3004 is planarized by a chemical mechanical polishing (CMP) method, insulating the silicon semiconductor devices.

Then, the contact plugs 3005 will be formed.

A mask is formed on the contact interlayer insulation film 3004 with photoresist through exposure. The contact interlayer insulation film 3004 outside the mask is removed by dry etching, forming via holes for electrically connecting the semiconductor devices together. The inner walls of the via holes are coated with barrier metal as a high melting point material such as tungsten by a sputter method, and the insides of the via holes are filled with the high melting point material by a CVD method. The tungsten film outside the via holes is removed by a CMP method, which leaves the tungsten in the via holes, forming the contact plugs 3005.

Next, a process of forming a copper line layer by a damascene method will be described with reference to FIG. 6B.

First, an insulation film 3101 is deposited on the contact interlayer insulation film 3004, and a photoresist pattern is formed in the insulation film 3101 by exposure. Trenches, and via holes as appropriate, corresponding to the photoresist pattern, are formed by dry etching. The inner walls of the trenches and the via holes are coated with barrier metal by a sputter method, and the insides of them are filled with copper by a copper plating method. The excessively-deposited copper is polished by a CMP method, forming a copper line 3102 illustrated in FIG. 6B. The top of the formed copper line 3102 is coated with a Cu diffusion prevention film 3103 to prevent diffusion and oxidation of copper.

Figure 6B:
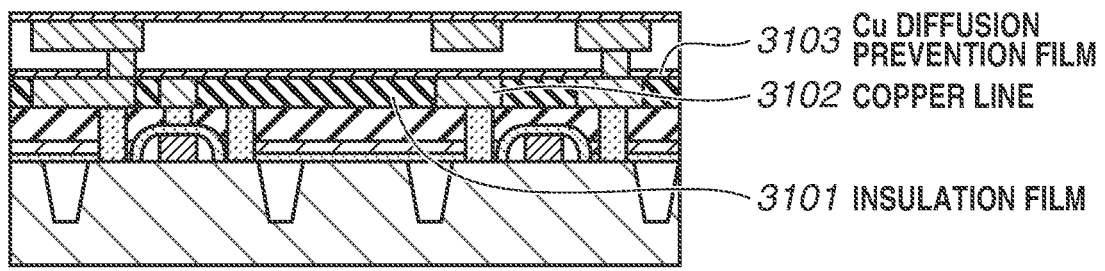

The process is repeated an appropriate number of times to form the copper line 3102, forming a layered structure as illustrated in FIG. 6B.

Figure 6C:
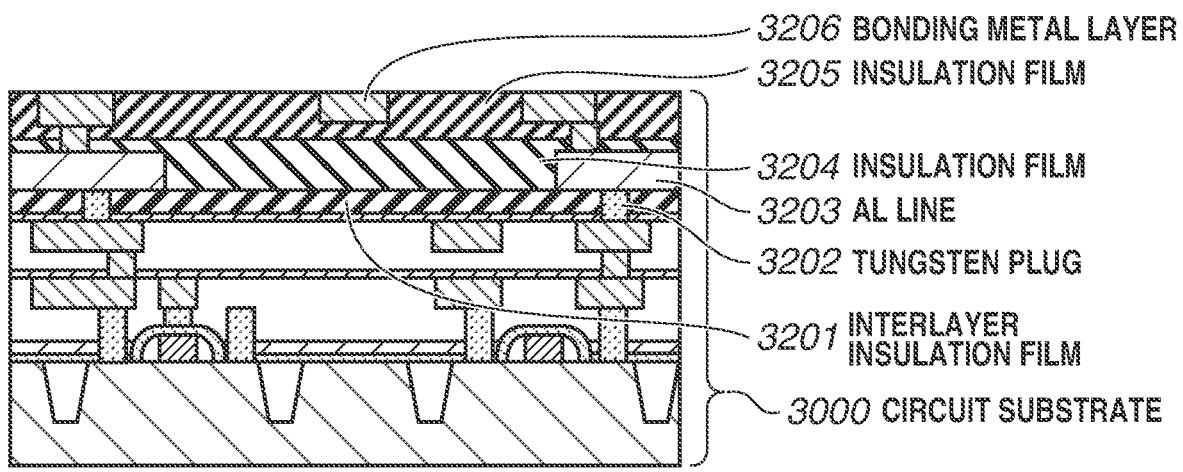

The formation of an aluminum (AL) line and a bonding layer will be described with reference to FIG. 6C.

After the copper line layer is formed, an AL line is formed as appropriate. For example, an interlayer insulation film 3201 is deposited as illustrated in FIG. 6C. An AL line 3203, which also serves as a connection pad, is formed on an interlayer insulation film 3201 via a tungsten plug 3202, and an insulation film 3204 is deposited thereon to form the AL line 3203. Alternatively, no AL line 3203 is applicable.

Lastly, a bonding layer will be formed for use in bonding the circuit substrate and another photodiode substrate together. The insulation film 3204 is planarized by a CMP method to eliminate irregularities, and an insulation film 3205 is deposited on the insulation film 3204 by a CVD method. A photoresist pattern is formed in the insulation film 3205. Trenches and via holes are formed by etching, and barrier metal is filled in the via holes by deposition. Copper is further deposited by copper plating, and the excessive Cu is removed by a CMP method. A bonding metal layer 3206 is formed as described above in combination with the contact plugs 3005 with the trenches and the via holes filled with copper by the Cu damascene method. A final structure of the circuit substrate has a partial surface as the surface of the Cu line and the other surface as the surface of the insulation film. This substrate is a circuit substrate 3000.

Next, a photodiode substrate will be manufactured.

The manufacturing method is basically the same as the method of manufacturing the circuit substrate except that a process of generating a photodiode is added.

Figure 7A:
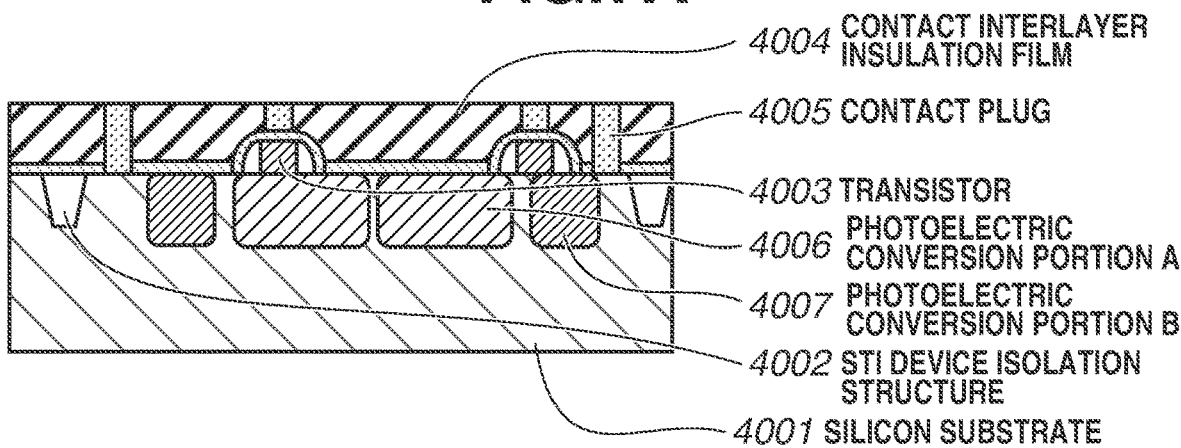
FIGS. 7A to 7C illustrate schematic cross-sectional structures as an example of a method of manufacturing a photoelectric conversion apparatus according to the first exemplary embodiment.

The formation of photodiodes, silicon semiconductor devices, and contact plugs will be described with reference to FIG. 7A.

First, STI device isolation structures 4002 are formed in a silicon substrate 4001.

The photomask for use in this process is designed based on the photodiode characteristics for a photoelectric conversion portion A 4006 and a photoelectric conversion portion B 4007 each to have a suitable area. In the present example, the area of the photoelectric conversion portion A 4006 is larger than that of the photoelectric conversion portion B 4007. The photodiodes including the photoelectric conversion portion A 4006 and the photoelectric conversion portion B 4007 are formed through exposure, etching, ion implantation, and film formation. During the formation of the photodiodes, silicon semiconductor devices such as transistors 4003 are formed. After that, a contact interlayer insulation film 4004 is deposited by a CVD method and planarized by a CMP method, insulating the silicon semiconductor devices.

Next, contact plugs 4005 will be formed.

A mask is formed on the contact interlayer insulation film 4004 with photoresist through exposure. The via holes for electrically connecting the semiconductor devices together are formed through dry etching. The inner walls of the via holes are coated with barrier metal as a high melting point material such as tungsten by a sputter method, and the insides of them are filled with the high melting point material by a CVD method. After that, the excessive tungsten film outside the via holes is removed by a CMP method, which leaves the tungsten in the via holes, forming the contact plugs 4005.

Figure 7B:
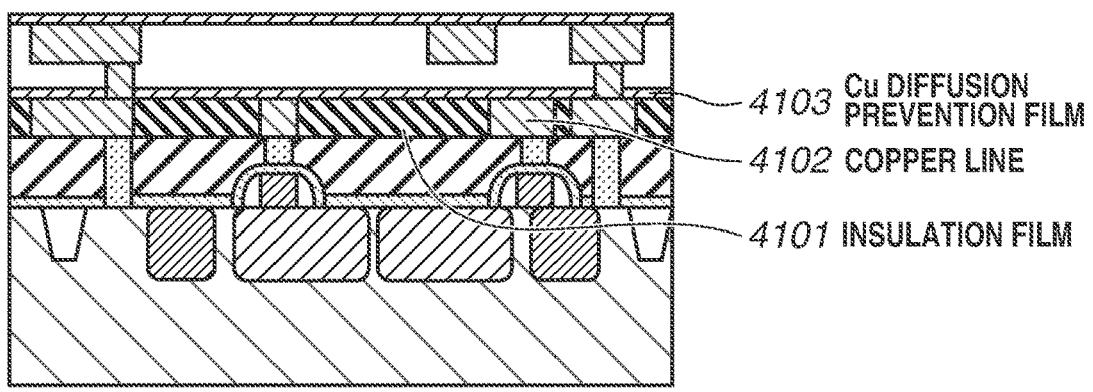

Next, a line layer illustrated in FIG. 7B will be formed by a damascene method.

First, an insulation film 4101 is deposited on the contact interlayer insulation film 4004. A photoresist pattern is formed in the insulation film 4101 through exposure, and trenches, and via holes as appropriate, are formed by dry etching. The inner walls of the trenches and the via holes are coated with barrier metal by a sputter method, and the insides of them are filled with copper by a copper plating method. The excessively-deposited copper is polished by a CMP method, forming a copper line 4102 illustrated in FIG. 7B. The top of the formed copper line 4102 is coated with a Cu diffusion prevention film 4103 to prevent diffusion and oxidation of copper.

The process is repeated an appropriate number of times to form the copper line 4102. After the copper line layer in a layered structure is formed as illustrated in FIG. 7B, an AL line is formed as appropriate. Alternatively, no AL line is applicable.

Figure 7C:
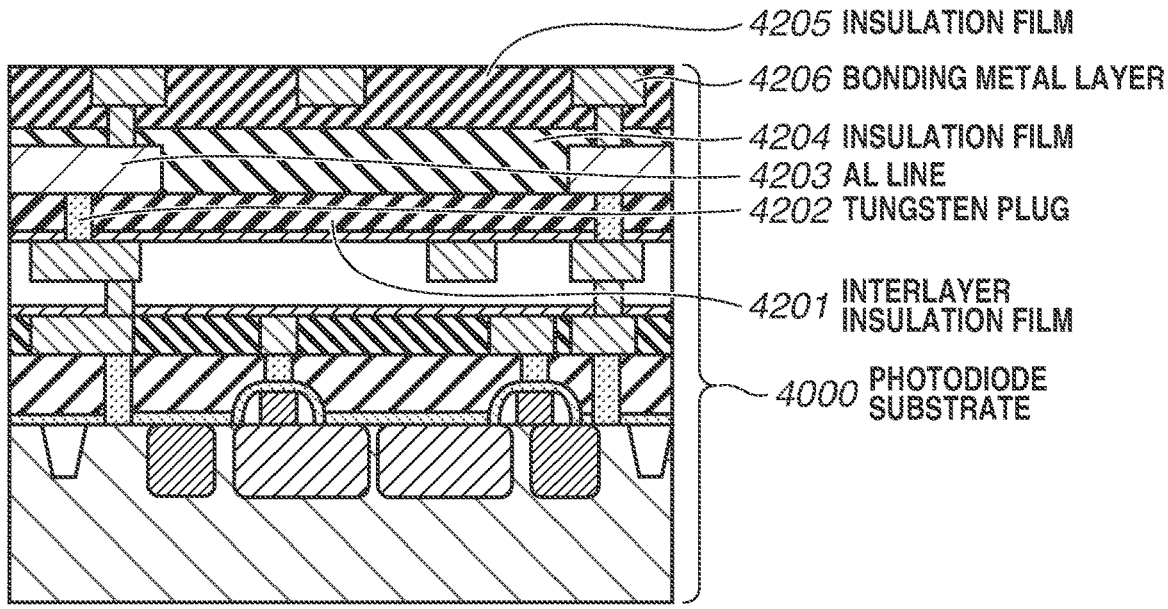

For example, as illustrated in FIG. 7C, an interlayer insulation film 4201 is deposited, and an AL line 4203, which also serves as a connection pad, is formed via tungsten plugs 4202. An insulation film 4204 is deposited over the AL line 4203 to form the AL line.

Lastly, a bonding layer will be formed for use in bonding the photodiode substrate and another circuit substrate together.

The insulation film 4204 is planarized by a CMP method of eliminating irregularities formed during the deposition. After that, an insulation film 4205 is deposited on the insulation film 4204 by a CVD method. A bonding metal layer 4206 is formed by a Cu damascene method of forming a mask through exposure, forming via holes by etching, depositing barrier metal in the via holes, depositing Cu by Cu plating, and removing the excessive Cu by a CMP method. A final structure of the photodiode substrate has a partial surface as the surface of the Cu line and the other surface as the surface of the insulation film. This substrate is a photodiode substrate 4000.

The next process of bonding the photodiode substrate 4000 and the circuit substrate 3000 together will be described in detail with reference to FIGS. 8A to 8I.

Figure 8A:
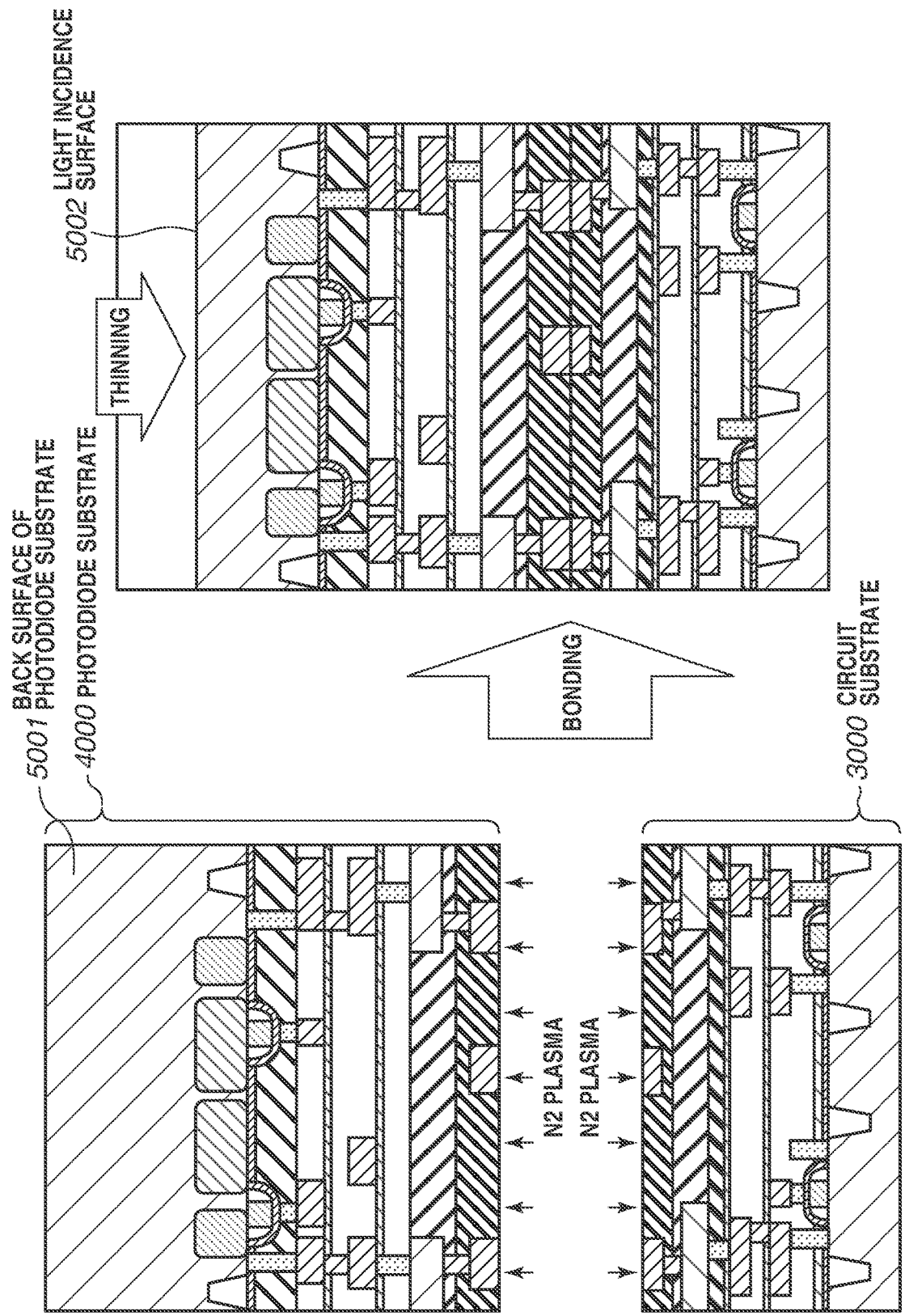
FIG. 8A illustrates a schematic cross-sectional structure as an example of a method of manufacturing a photoelectric conversion apparatus according to the first exemplary embodiment.

FIG. 8A will be described.

The surface with the bonding metal of the photodiode substrate 4000 and the surface with the bonding metal of the circuit substrate 3000 are activated with $N_2$ plasma, and a bonding apparatus bonds the activated surfaces made to face each other together. After that, it is annealed at 200 degrees Celsius to 450 degrees Celsius to increase the adhesive force. After the annealing, a surface 5001, the Si substrate layer, of the photodiode substrate 4000 opposite the surface bonded to the circuit substrate 3000 is polished to have a thickness of about 3 μm. The thinned surface 5002 is a light incidence surface.

Figure 8B:
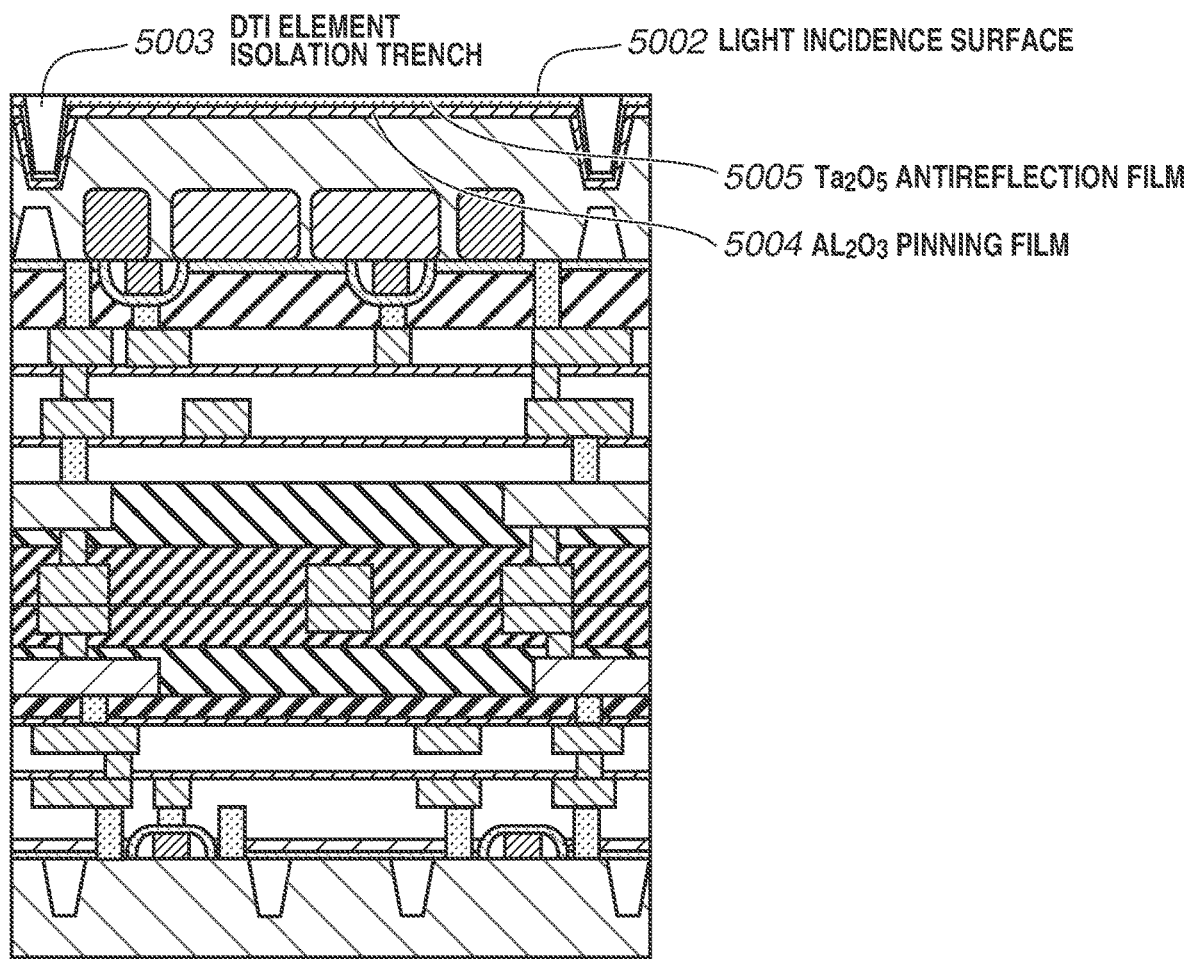
FIG. 8B illustrates a schematic cross sectional structure as an example of a method of manufacturing a photoelectric conversion apparatus according to the first exemplary embodiment.

As illustrated in FIG. 8B, a deep trench isolation (DTI) element isolation trench 5003, an $AL_2O_3$ pinning film 5004, and a $Ta_2O_5$ antireflection film 5005 will be formed on the light incidence surface 5002.

First, a mask is formed on the light incident surface 5002 through exposure and undergoes dry etching, forming a trench structure in the light incidence surface 5002. Next, the pinning film 5004 to reduce dark current and the antireflection film 5005 to prevent light reflection are deposited. For example, $Al_2O_3$, $HfO_2$, and $HfSiO_4$ are used for the pinning film 5004, and $Ta_2O_5$, SiN, and SiON are used for the antireflection film 5005. The materials for these films are not limited to those as long as other materials are used for the same purposes.

Further, the total film thickness of the pinning film 5004 and the antireflection film 5005 is less than 300 nm.

The insufficiently deposited trench portions are fully coated with the isolation film by a plasma-enhanced chemical vapor deposition (PE-CVD) method, an atomic layer deposition (ALD) method, or a sub-atmospheric chemical vapor deposition (SA-CVD) method, forming the DTI element isolation trench 5003. If each pixel is disposed on a sufficiently large region, no DTI element isolation trench 5003 is applicable.

Figure 8C:
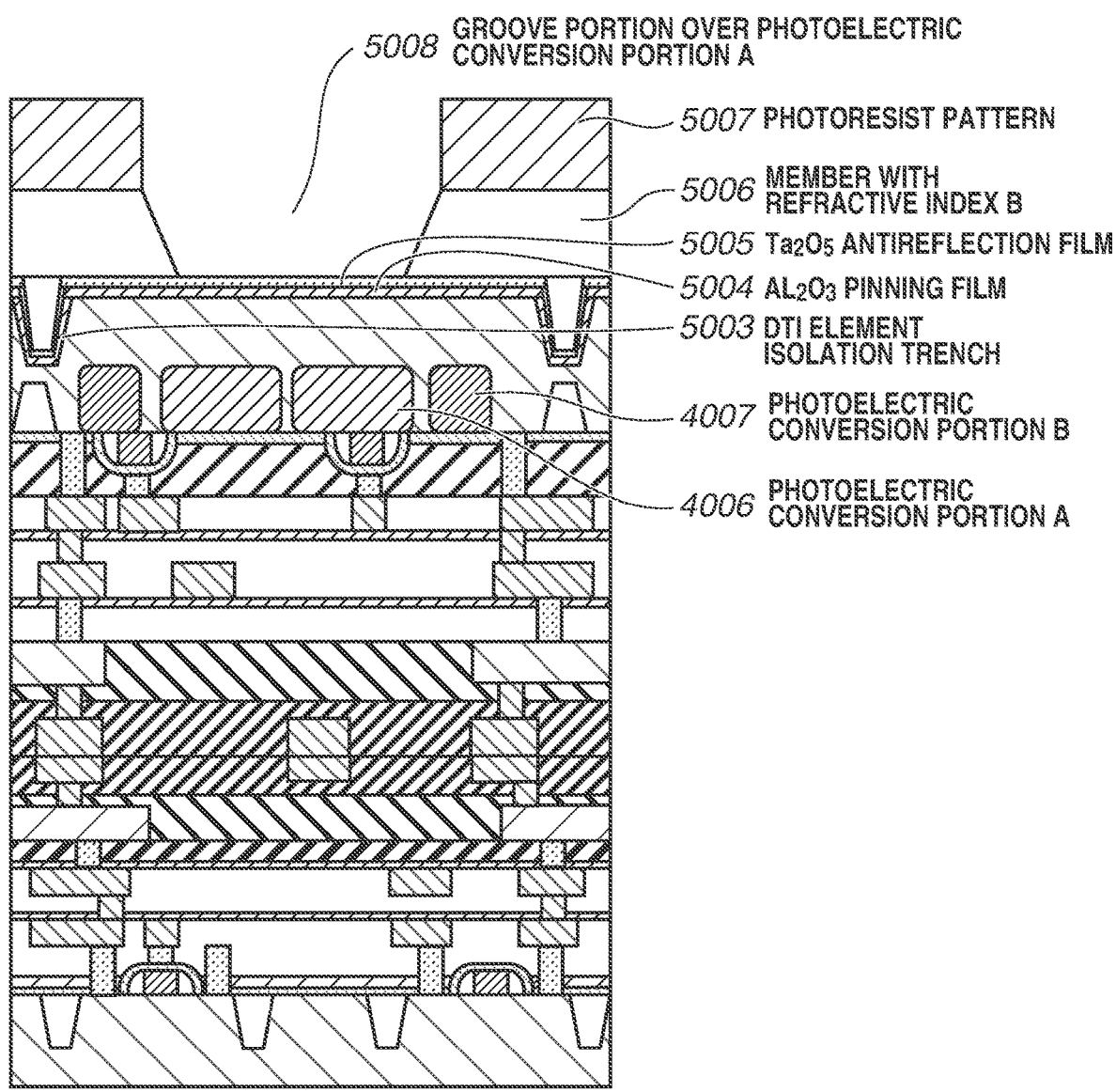
FIG. 8C illustrates a schematic cross-sectional structure as an example of a method of manufacturing a photoelectric conversion apparatus according to the first exemplary embodiment.

Next, a process of forming a member with a refractive index A and a member with a refractive index B lower than the refractive index A will be described with reference to FIG. 8C.

First, a member 5006 with the refractive index B is deposited on the antireflection film 5005 to overlap the photoelectric conversion portion B 4007 having a small area in the depth direction. The member 5006 can be, for example, a SiO film, a SiN film, a SiON film, or a SiOCH film, which is a low-K film, formed by a PE-CVD method, or an organic film containing C, O, S, or H can be formed by coating.

Then, a region for forming the member with the refractive index A is formed inside the member 5006 with the refractive index B.

To dispose the member with the refractive index A over the photoelectric conversion portion A 4006, a photoresist pattern 5007, which matches the shape of the member with the refractive index A, is formed. The excessive portion of the member 5006 with the refractive index B is removed by dry etching using the photoresist pattern 5007, forming a groove portion 5008 over the photoelectric conversion portion A 4006. The photoresist that is no longer needed is removed by ashing or stripping.

Figure 8D:
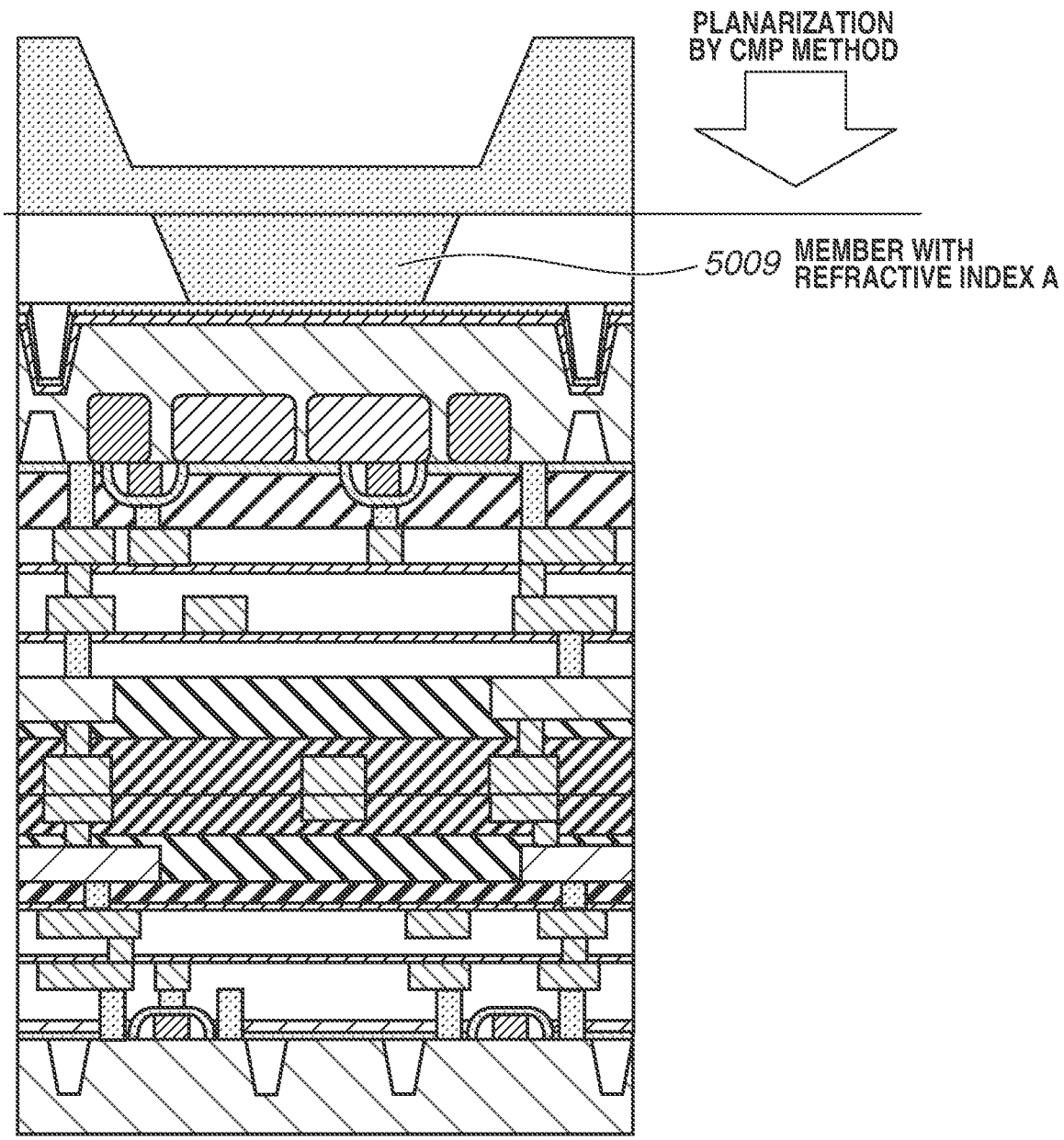
FIG. 8D illustrates a schematic cross-sectional structure as an example of a method of manufacturing a photoelectric conversion apparatus according to the first exemplary embodiment.

After that, the member 5009 with the refractive index A is deposited over the member with the refractive index A and the member 5006 with the refractive index B, which forms the structure illustrated in FIG. 8D.

In this process, a member having a higher refractive index (refractive index A) than the refractive index B of the member 5006, such as a SiN film by a PE-CVD method, is deposited as the member 5009 with the refractive index A. The member 5009 with the refractive index A can be any material having a relatively higher refractive index than the refractive index B of the member 5006, e.g., a SiN film, a SiON film, or a SiOCH film, which is a low-K film, or an organic film containing C, O, S, or H, which can be formed by coating. An optical material that contains two or more of the chemical elements Si, N, O, H, C, and S is typically used. The irregularities formed in the surface after the member deposition is polished by a CMP method or planarized using an etch back method.

Figure 8E:
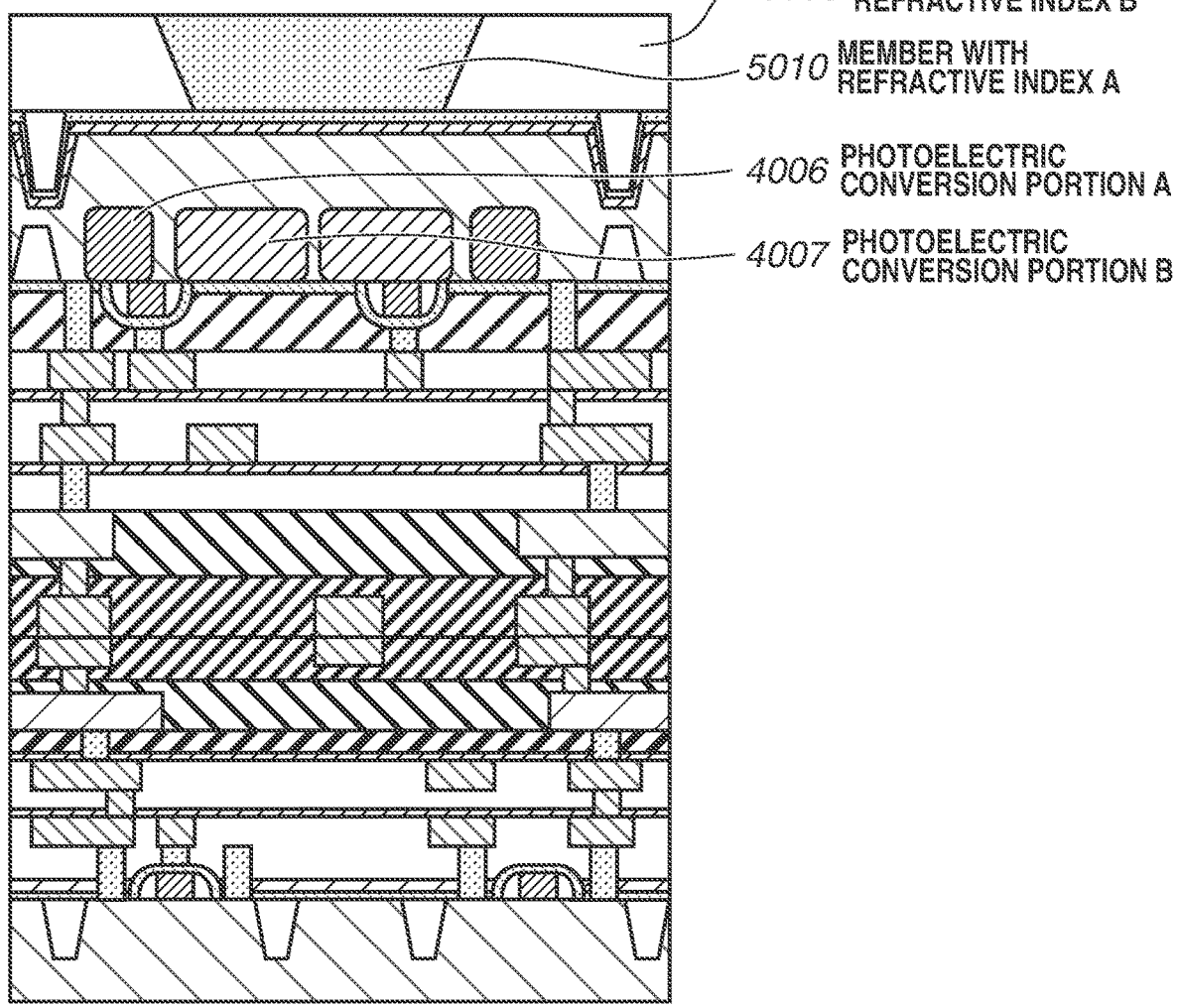
FIG. 8E illustrates a schematic cross-sectional structure as an example of a method of manufacturing a photoelectric conversion apparatus according to the first exemplary embodiment.

Finally, a structure including a member 5010 with the refractive index A and the member 5006 with the refractive index B as illustrated in FIG. 8E is formed. The members 5006 and 5010 are formed with a thickness of 0.3 µm to 3.0 µm, and the thickness is adjustable based on optical characteristics such as the size of the photodiode, the refractive index of the insulation film, and the shapes of the inner lens and the microlens.

As described above, the total film thickness of the pinning film 5004 and the antireflection film 5005 is less than 300 nm, and the member 5010 with the refractive index A and the member 5006 with the refractive index B are formed on the antireflection film 5005. Thus, assuming that a large PD and a small PD are arranged in the first plane and that the high refractive index member 2006 and the low refractive index member 2007 are arranged in the second plane nearer the light incidence surface than the first plane, the pinning film 5004 and the antireflection film 5005 are between the first plane and the second plane. The distance between the first plane and the second plane is settable to 300 nm or less.

The formation of a light shield wall will be described.

Figure 8F:
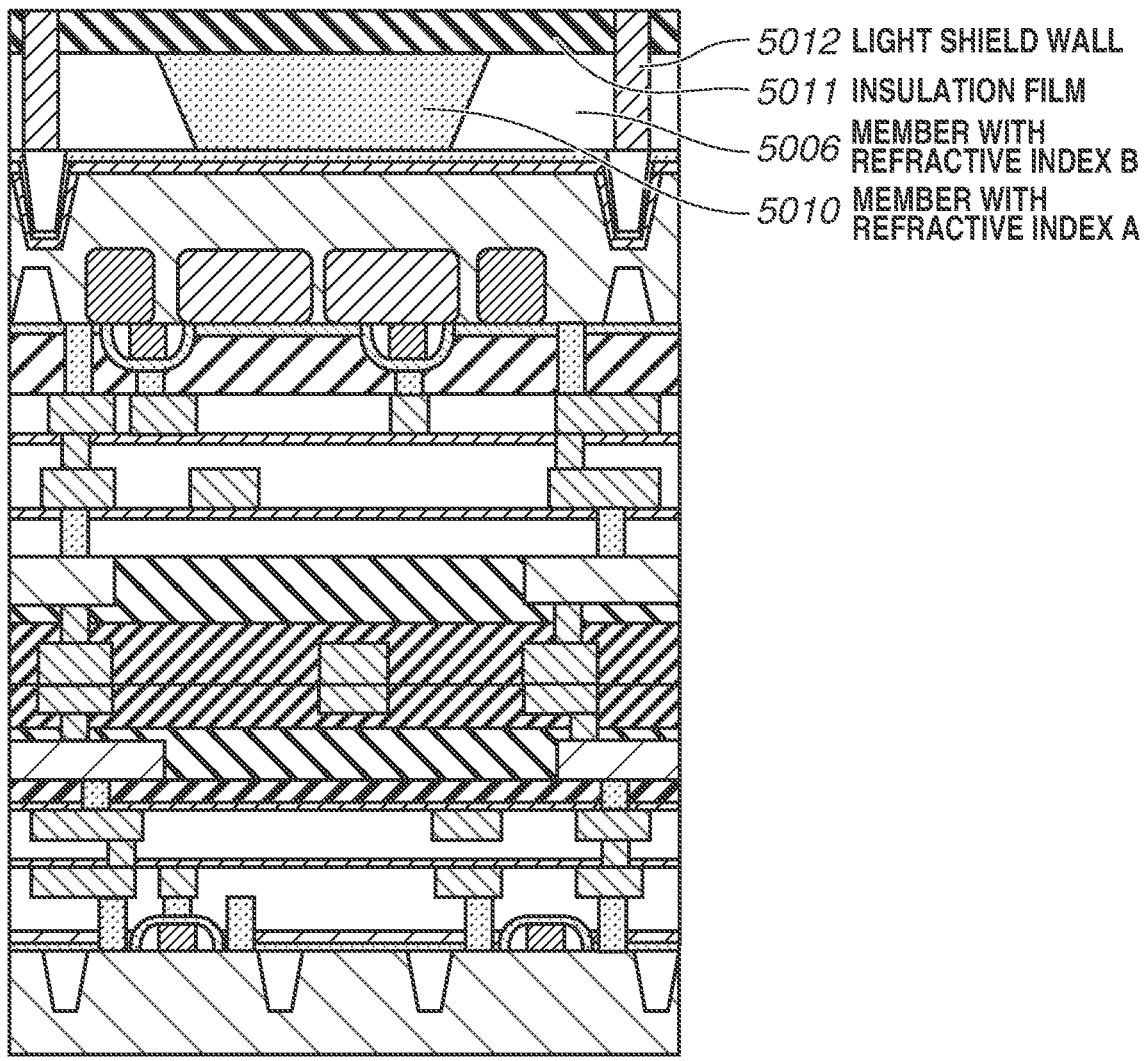
FIG. 8F illustrates a schematic cross-sectional structure as an example of a method of manufacturing a photoelectric conversion apparatus according to the first exemplary embodiment.

In FIG. 8F, after the members 5006 and 5010 suitable for the photodiode characteristics are formed, an insulation film 5011 is deposited, and a light shield wall 5012 is formed in each pixel to prevent lateral leakage of light.

To form the light shield wall 5012, for example, a mask is formed through exposure, then a trench is formed by dry etching using the formed mask. Further, the inner wall of the formed trench is coated with barrier material by a sputter method, and then the trench is coated with tungsten using a tungsten CVD method. In this case, the excessive tungsten material covering the top surfaces of the photodiodes is removed by a CMP method.

The formation of an inner lens will be described.

Figure 8G:
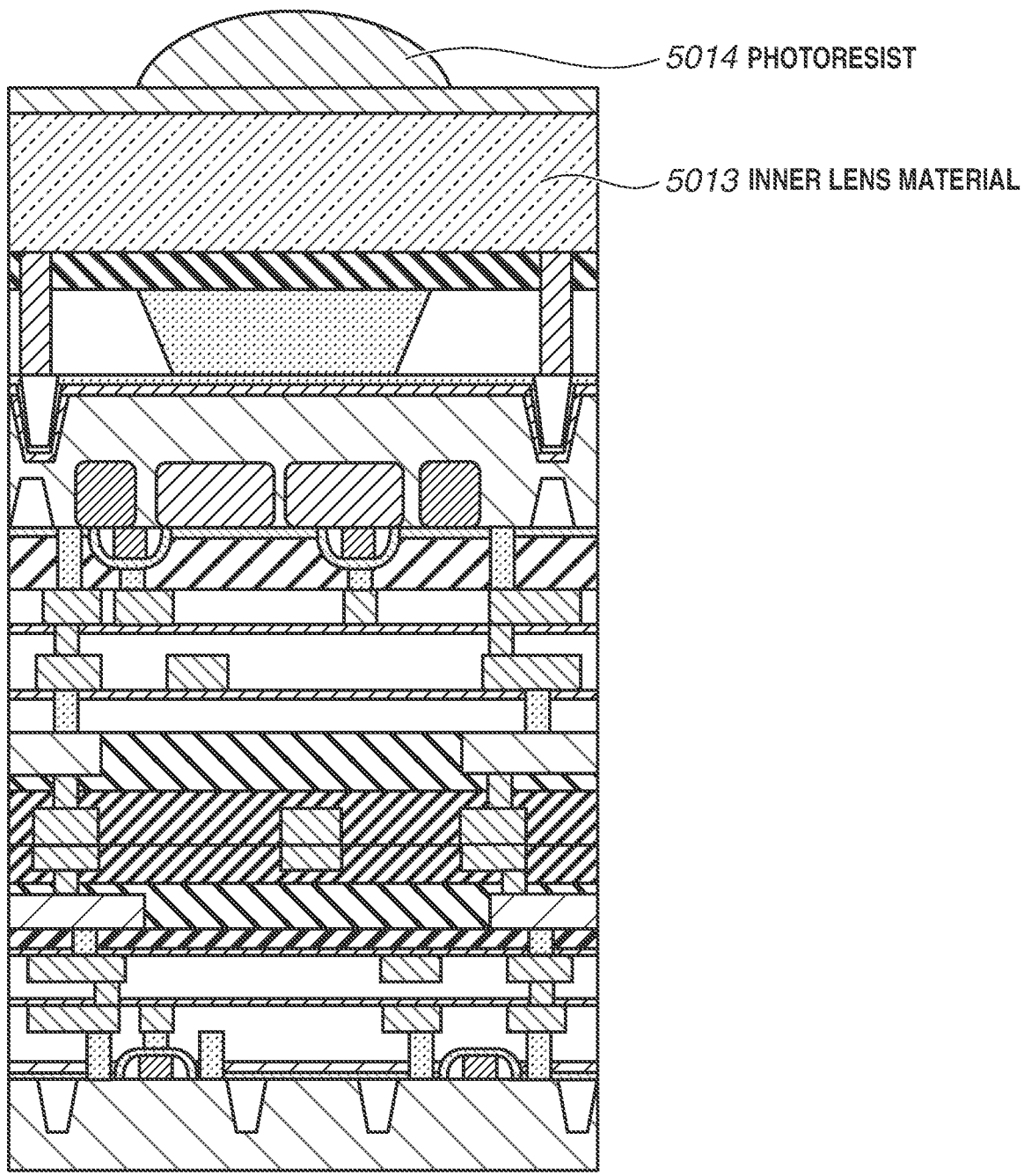
FIG. 8G illustrates a schematic cross-sectional structure as an example of a method of manufacturing a photoelectric conversion apparatus according to the first exemplary embodiment.
Figure 8H:
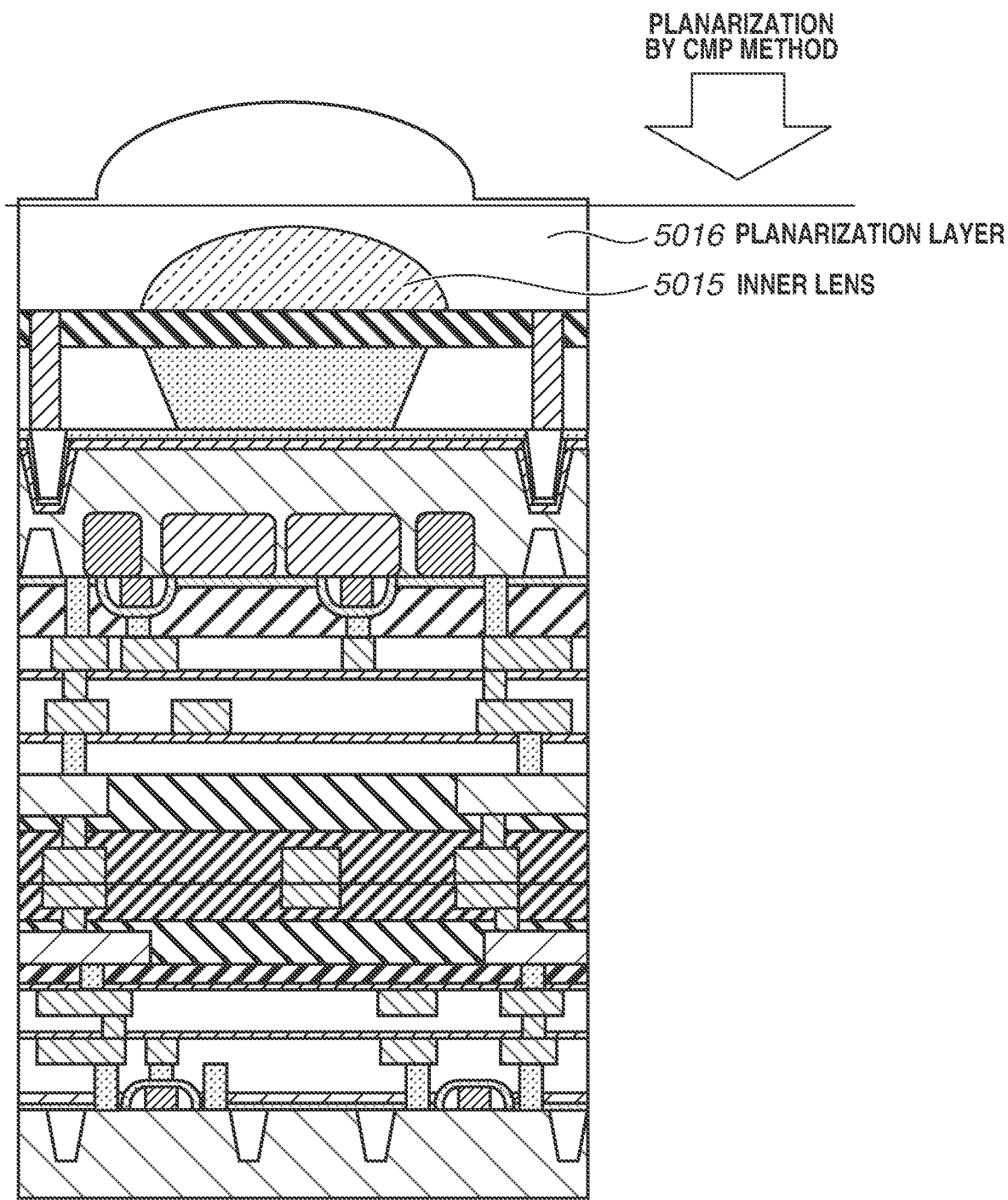
FIG. 8H illustrates a schematic cross-sectional structure as an example of a method of manufacturing a photoelectric conversion apparatus according to the first exemplary embodiment.

As illustrated in FIG. 8G, an inner lens material 5013 is deposited following the formation of the light shield wall 5012, and a photoresist 5014 is formed in a lens shape by exposure and reflow. An inner lens 5015 is formed by dry etching with the photoresist 5014 in the lens shape as a mask (FIG. 8H). If the optical characteristics are sufficient, no inner lens 5015 is applicable.

Figure 8I:
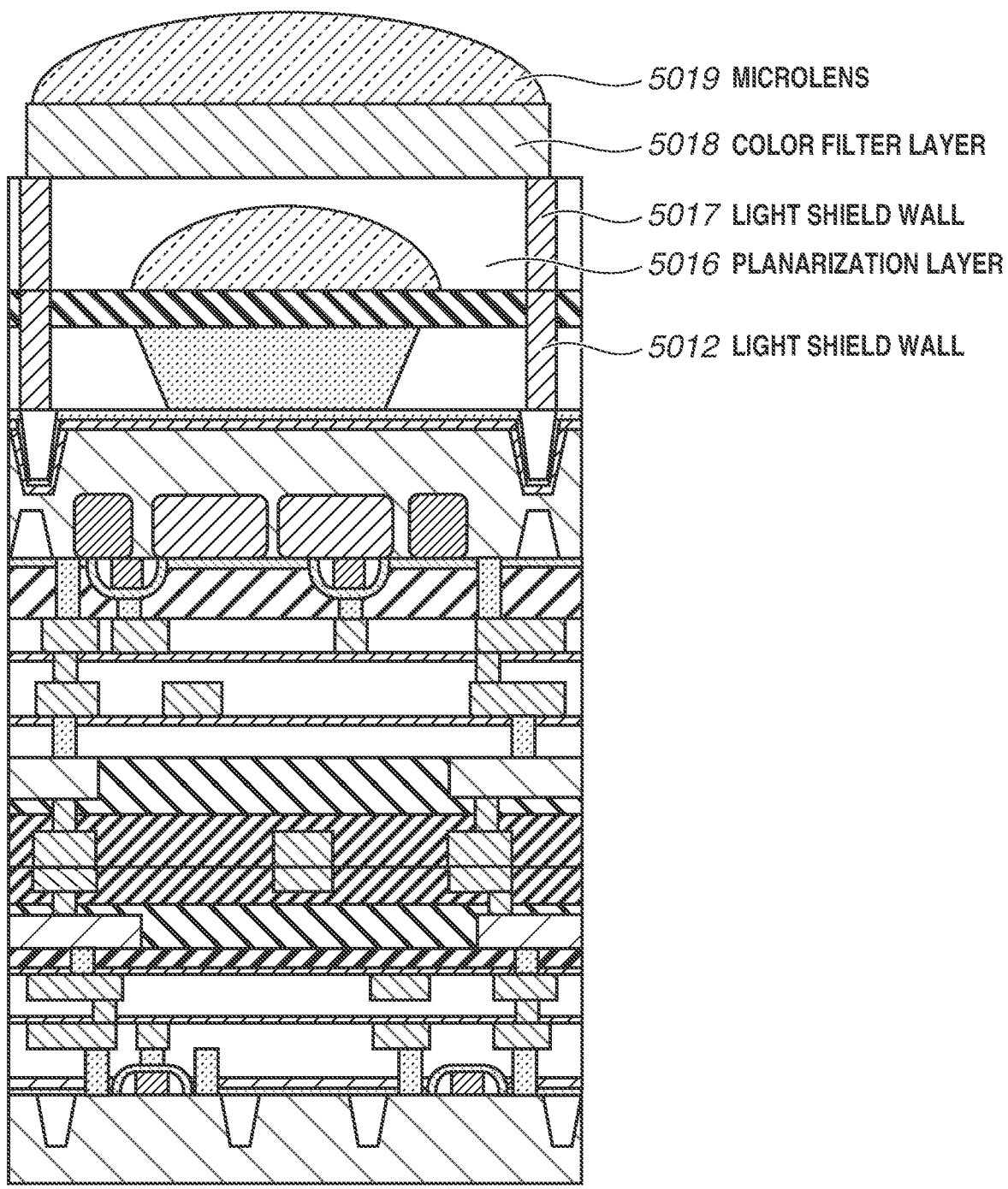
FIG. 8I illustrates a schematic cross-sectional structure as an example of a method of manufacturing a photoelectric conversion apparatus according to the first exemplary embodiment.

After the inner lens 5015 is formed, a planarization layer 5016 is deposited over the inner lens 5015, and the irregularities in the surface are eliminated by a CMP method. As illustrated in FIG. 8I, a light shield wall 5017 is formed as appropriate using a method similar to the method for the light shield wall 5012.

Lastly, a color filter material corresponding to the color assigned to each pixel is applied, and a color filter layer 5018 is formed by exposure and development. The process is repeated the number of times corresponding to the number of colors.

A microlens material is applied to the color filter layer 5018, and the applied microlens material is exposed and developed. The resulting microlens material is formed in a microlens shape by reflow, which produces a microlens 5019.

(Second Manufacturing Method)

A method of manufacturing a photoelectric conversion apparatus according to the second exemplary embodiment will be described.

The following is a manufacturing method of manufacturing a photoelectric conversion apparatus by bonding a manufactured circuit substrate and a manufactured photodiode substrate together. A method of forming a circuit substrate is similar to that illustrated in FIGS. 6A to 6C, so that redundant descriptions thereof will be omitted, and mainly the difference from the first manufacturing method according to the first exemplary embodiment will be described.

Figure 9A:
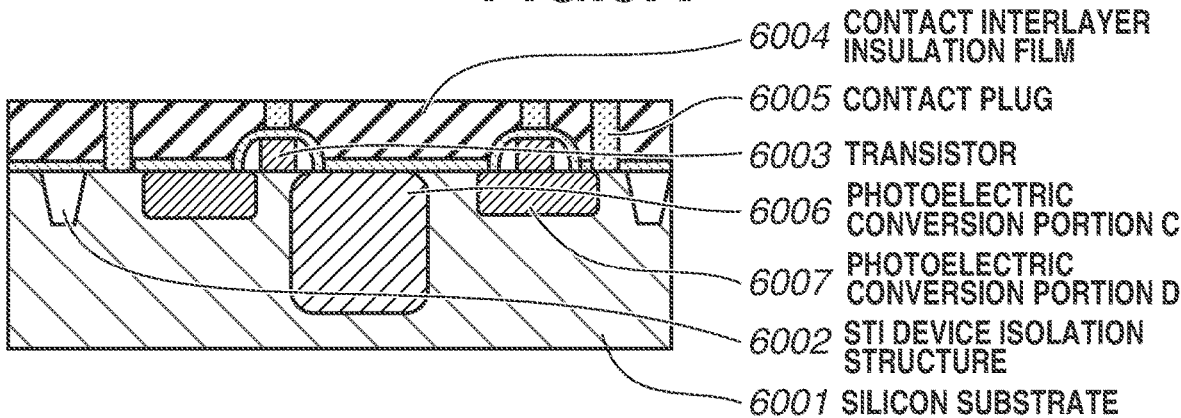
FIGS. 9A to 9C illustrate schematic cross-sectional structures as an example of a method of manufacturing a photoelectric conversion apparatus according to the second exemplary embodiment.
Figure 9B:
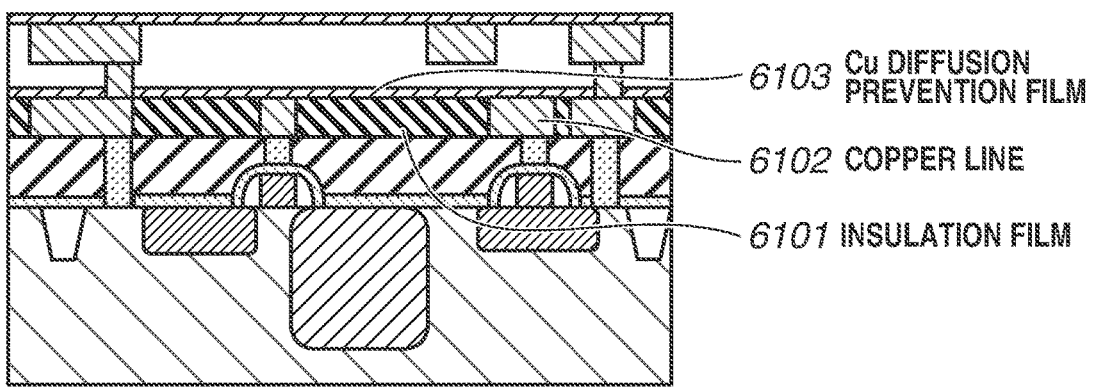
Figure 9C:
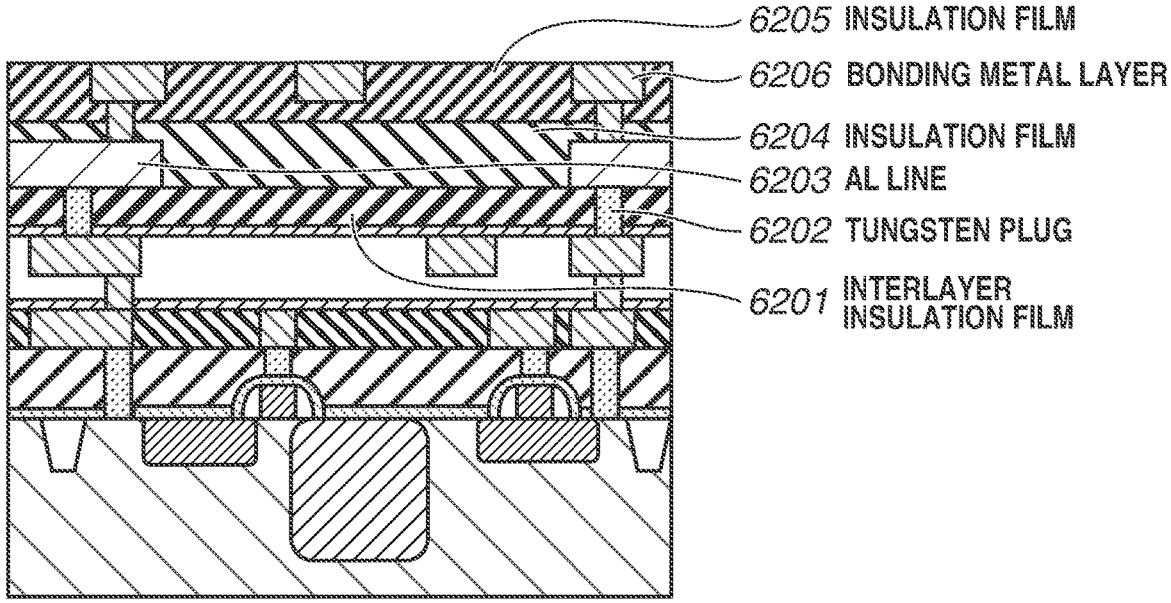

FIGS. 9A to 9C illustrate a process of forming a photodiode substrate according to the present exemplary embodiment.

The formation of photodiodes and silicon semiconductor devices will be described (FIG. 9A).

The manufacturing method has features in the formation of N-type carrier regions in a photoelectric conversion portion C 6006 and a photoelectric conversion portion D 6007 based on photodiode characteristics in FIG. 9A. The N-type carrier concentration of the photoelectric conversion portion C 6006 is lower than that of the photoelectric conversion portion D 6007, so that ion implantation conditions are adjusted to make the amount of saturated charge per unit area in the photoelectric conversion portion C 6006 less than in the photoelectric conversion portion D 6007.

Photodiodes including the photoelectric conversion portion C 6006 and the photoelectric conversion portion D 6007 are formed by exposure, etching, ion implantation, and film formation while silicon semiconductor devices such as a transistor 6003 are formed. After that, a contact interlayer insulation film 6004 is deposited by a CVD method and planarized by a CMP method, and the silicon semiconductor devices are insulated.

The process illustrated in FIGS. 9B and 9C is similar to that in FIGS. 7B and 7C, so that redundant descriptions thereof will be omitted. The structure illustrated in FIG. 6C is eventually formed by the manufacturing method.

Figure 10A:
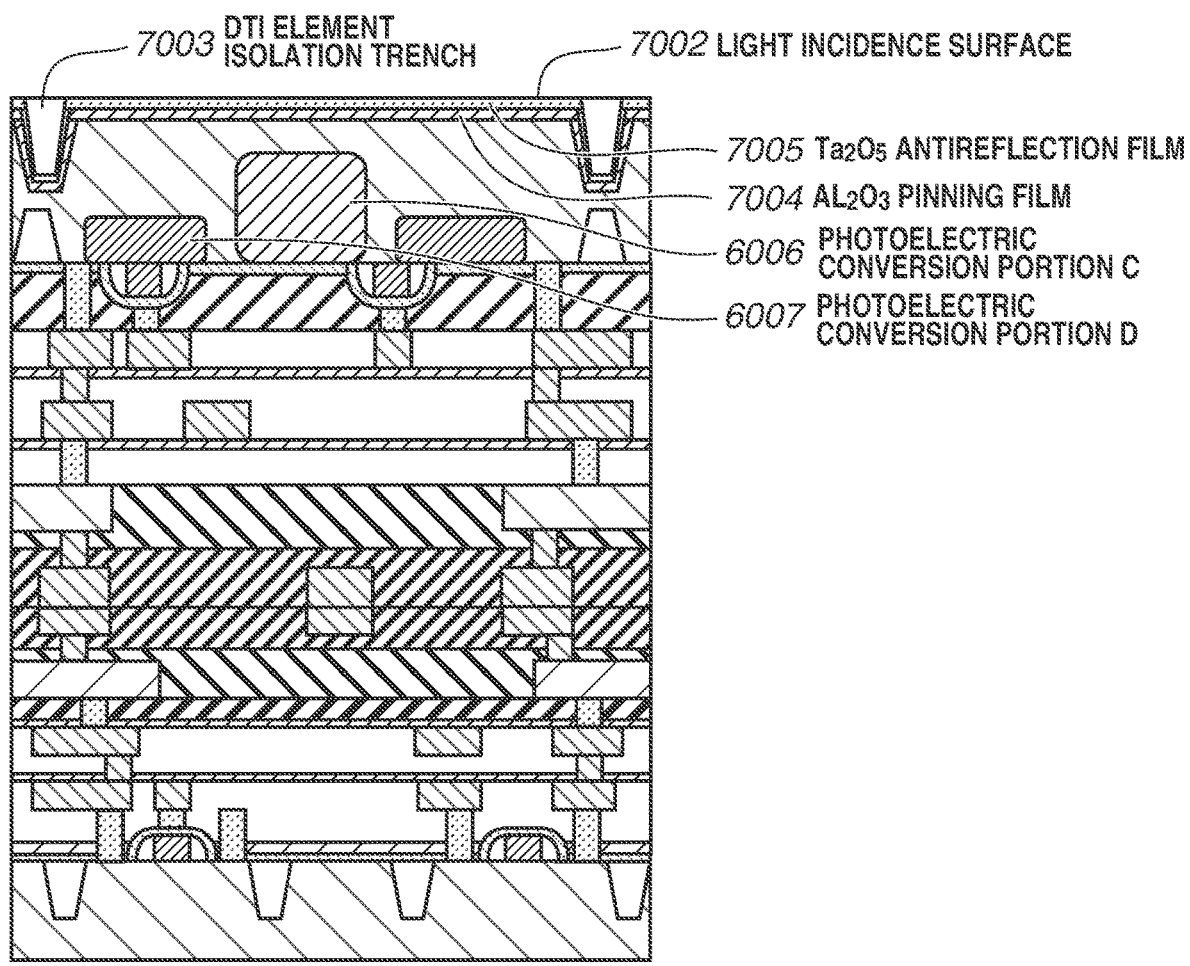
FIG. 10A illustrates a schematic cross-sectional structure as an example of a method of manufacturing a photoelectric conversion apparatus according to the second exemplary embodiment.

FIG. 10A illustrates a process from the bonding of a circuit substrate and a photodiode substrate together through the forming of an antireflection film.

As with the description with reference to FIG. 8A, after the circuit substrate and the photodiode substrate are bonded together, the photodiode substrate is thinned, forming a light incidence surface 7002.

After that, the formation of a DTI element isolation trench 7003, the deposition of an $AL_2O_3$ pinning film 7004, and the deposition of a $Ta_2O_5$ antireflection film 7005 is performed similarly. In this case, materials used for the same purposes other than those described herein as an example are also employable as in FIG. 8B. Further, the total film thickness of the $AL_2O_3$ pinning film 7004 and the $Ta_2O_5$ antireflection film 7005 is less than 300 nm.

Eventually, the DTI element isolation trench 7003 is coated with oxidation film, which forms the structure illustrated in FIG. 10A. If each pixel is disposed in a sufficiently large region, no DTI element isolation trench 7003 is applicable, as with the description with reference to FIG. 8B.

Next, a process will be described of forming members C and D to make the refractive index of the member D higher than the refractive index of the member C.

Figure 10B:
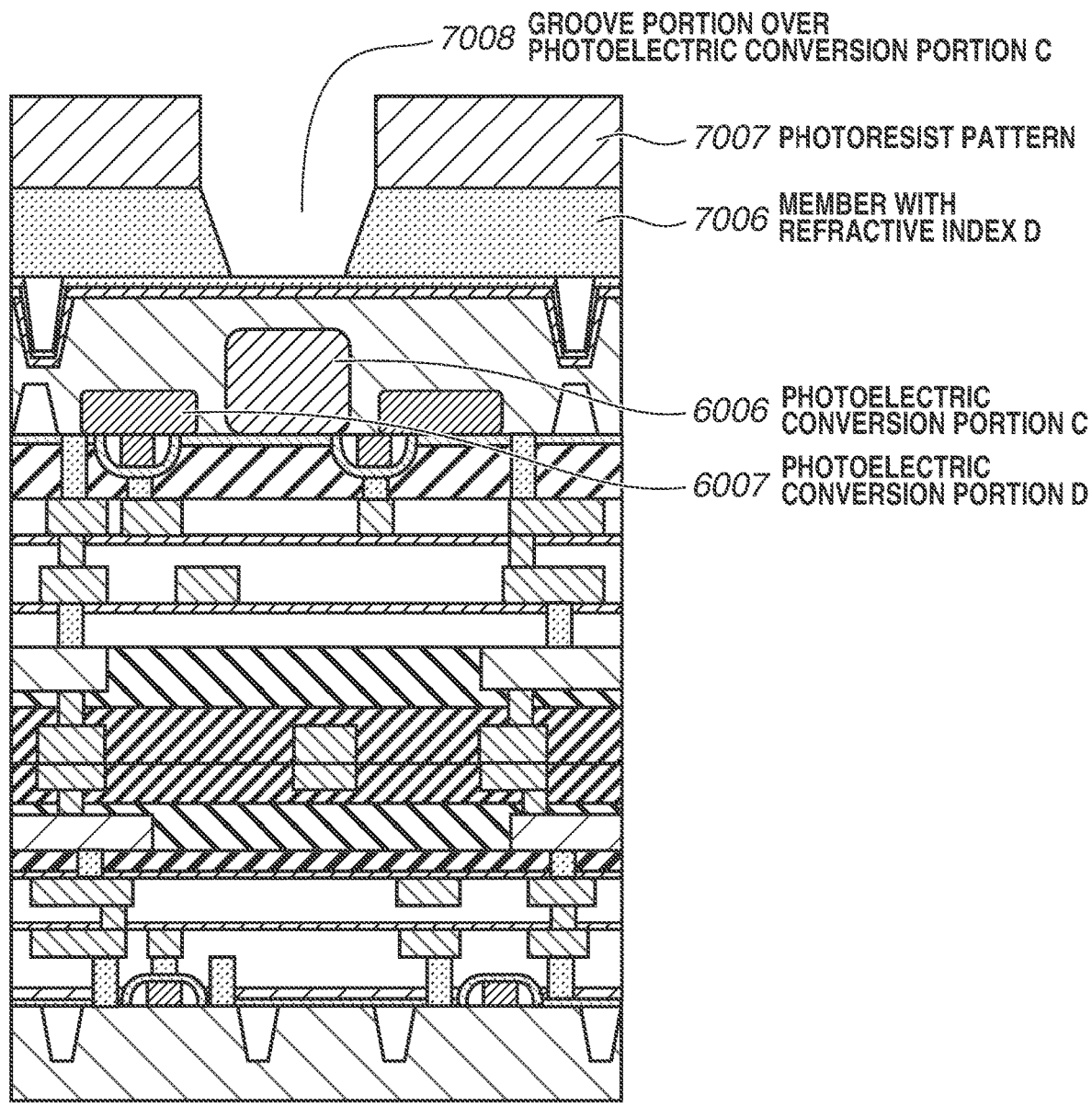
FIG. 10B illustrates a schematic cross-sectional structure as an example of a method of manufacturing a photoelectric conversion apparatus according to the second exemplary embodiment.

First, as illustrated in FIG. 10B, a member 7006 with a refractive index D is deposited on the antireflection film 7005 to overlap the photoelectric conversion portion D 6007 with a low N-type carrier concentration in the depth direction. For example, a SiO film, a SiN film, a SiON film, or a SiOCH film, which is a low-K film, formed by a PE-CVD method, can be employed, or the formation of an organic film containing C, O, S, or H by coating is applicable.

Then, a region for forming a member with a refractive index C is formed inside the member 7006 with the refractive index D. To dispose the member with the refractive index C over the photoelectric conversion portion C 6006, a photoresist pattern 7007, which matches the shape of the member 7006 with the refractive index D, is formed. The excessive part of the member 7006 with the refractive index D is removed by dry etching using the photoresist pattern 7007, forming a groove portion 7008 over the photoelectric conversion portion C 6006. The photoresist that is no longer needed is removed by ashing or stripping.

After that, a member 7010 with the refractive index C is deposited on the member 7006 with the refractive index D, which forms the structure illustrated in FIG. 10C.

In this process, a member with a lower refractive index (refractive index C), as the member 7010 with the refractive index C, than the refractive index D of the member 7006, e.g., a SiN film by a PE-CVD method, is disposed. The material of the member 7010 with the refractive index C can be any material with a relatively lower refractive index than the refractive index D of the member 7006. For example, a SiN film, a SiON film, a SiOCH film, which is a low-K film, or an organic film containing C, O, S, or H can be formed by coating. An optical material containing two or more of the elements Si, N, O, H, C, and S is typically used. The irregularities formed on the surface after the member deposition is polished by a CMP method or planarized using an etch back method.

Figure 10D:
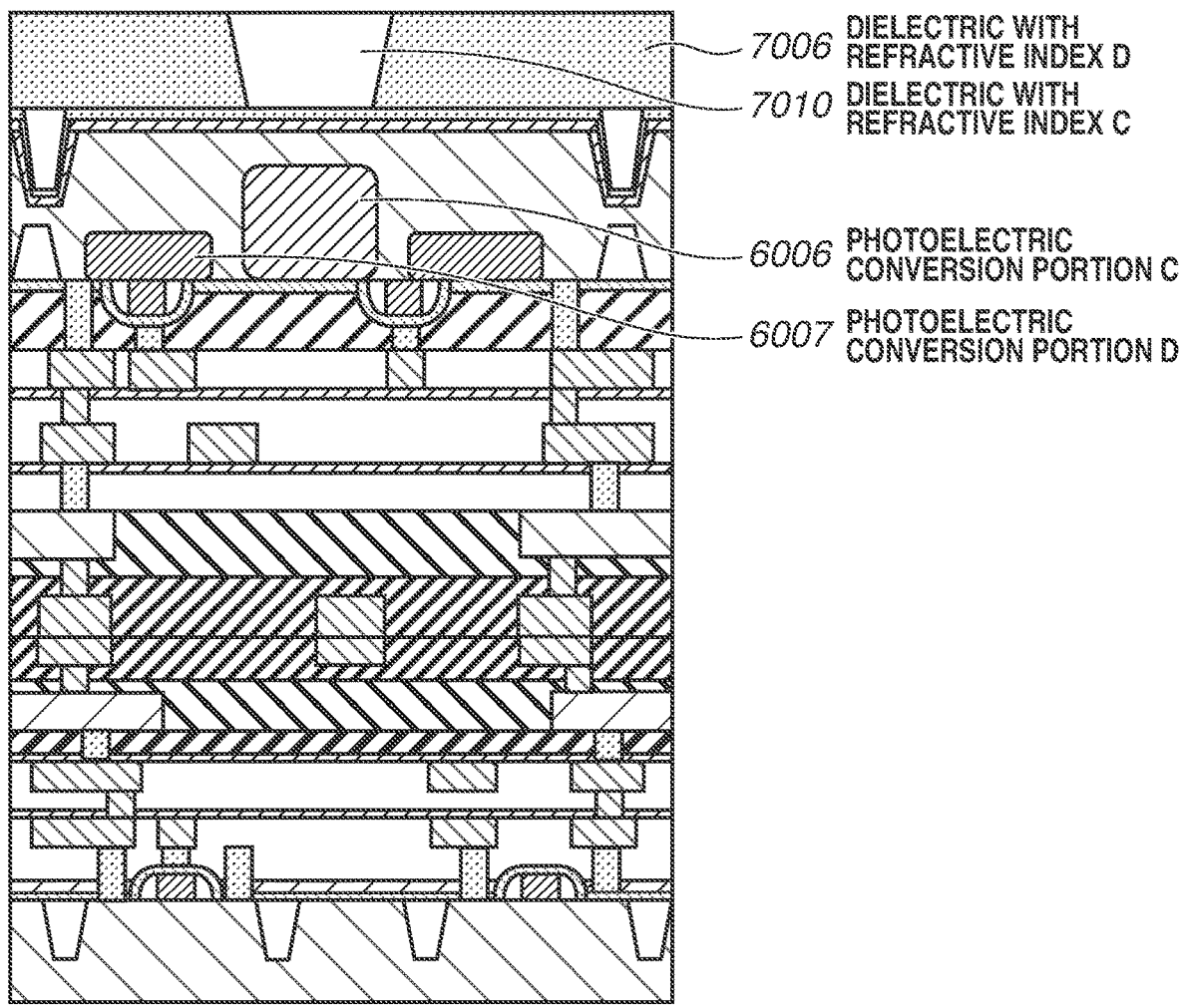
FIG. 10D illustrates a schematic cross-sectional structure as an example of a method of manufacturing a photoelectric conversion apparatus according to the second exemplary embodiment.

The structure including the member 7010 with the refractive index C and the member 7006 with the refractive index D as illustrated in FIG. 10D is eventually formed.

Further, the member 7006 with the refractive index D and the member 7010 with the refractive index C are formed with a thickness of 0.3 μm to 3.0 μm. The thickness is adjusted based on optical characteristics such as the size of the photodiode, the refractive index of the insulation film, and the shapes of the inner lens and the microlens.

The foregoing process has manufactured a semiconductor substrate illustrated in FIG. 10D.

The difference between the structures of FIGS. 8E and 10D is as follows.

In FIG. 8E, the structure has the material with the relatively high refractive index disposed over the photodiode with the relatively large size and high sensitivity, and the material with the relatively low refractive index disposed over the photodiode with the relatively small size and low sensitivity. In FIG. 10D, the structure has the material with the relatively high refractive index disposed over the photodiode with the relatively high impurity concentration and high sensitivity, and the material with the relatively low refractive index disposed over the photodiode with the relatively low impurity concentration and low sensitivity.

Figure 10E:
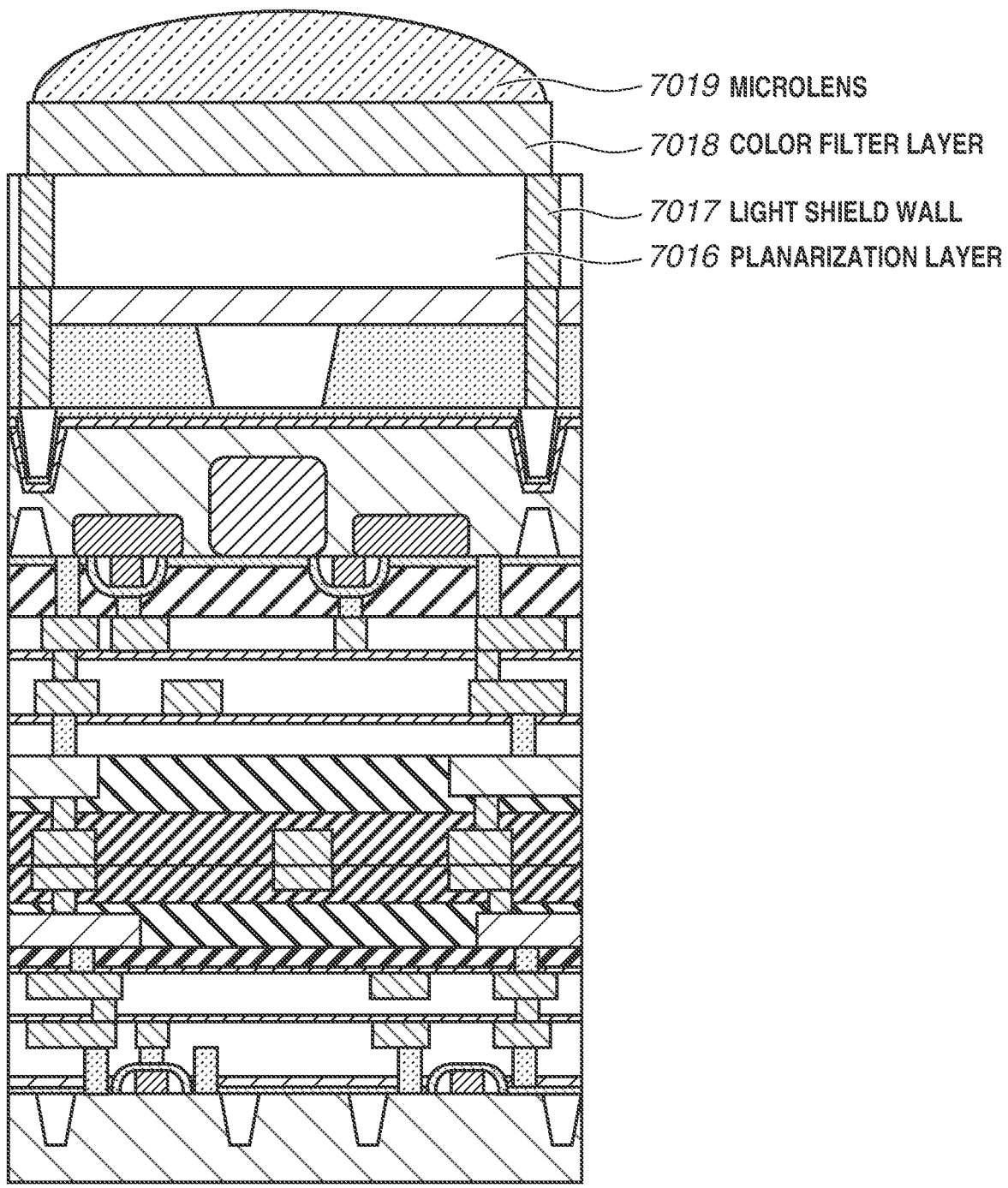
FIG. 10E illustrates a schematic cross-sectional structure as an example of a method of manufacturing a photoelectric conversion apparatus according to the second exemplary embodiment.

After that, the structure illustrated in FIG. 10E is formed through the process illustrated in FIGS. 8F to 8I.

Lastly, a manufacturing method will be described of forming the circuit as the example illustrated in FIG. 5.

To form a circuit substrate including the circuit illustrated in FIG. 5, a pattern is added to form an OFD circuit on a photomask in forming transistors in the method of manufacturing a circuit substrate.

The process of forming a photodiode substrate and the process after the bonding of a circuit substrate and a photodiode substrate together are not limited to the first and second manufacturing methods described above, and any other methods can be employed.

Further, the pixel can be a front-side illumination complementary metal oxide semiconductor (front-side illumination CMOS) sensor or a back-side illumination complementary metal oxide semiconductor (back-side illumination CMOS) sensor.

Figure 11:
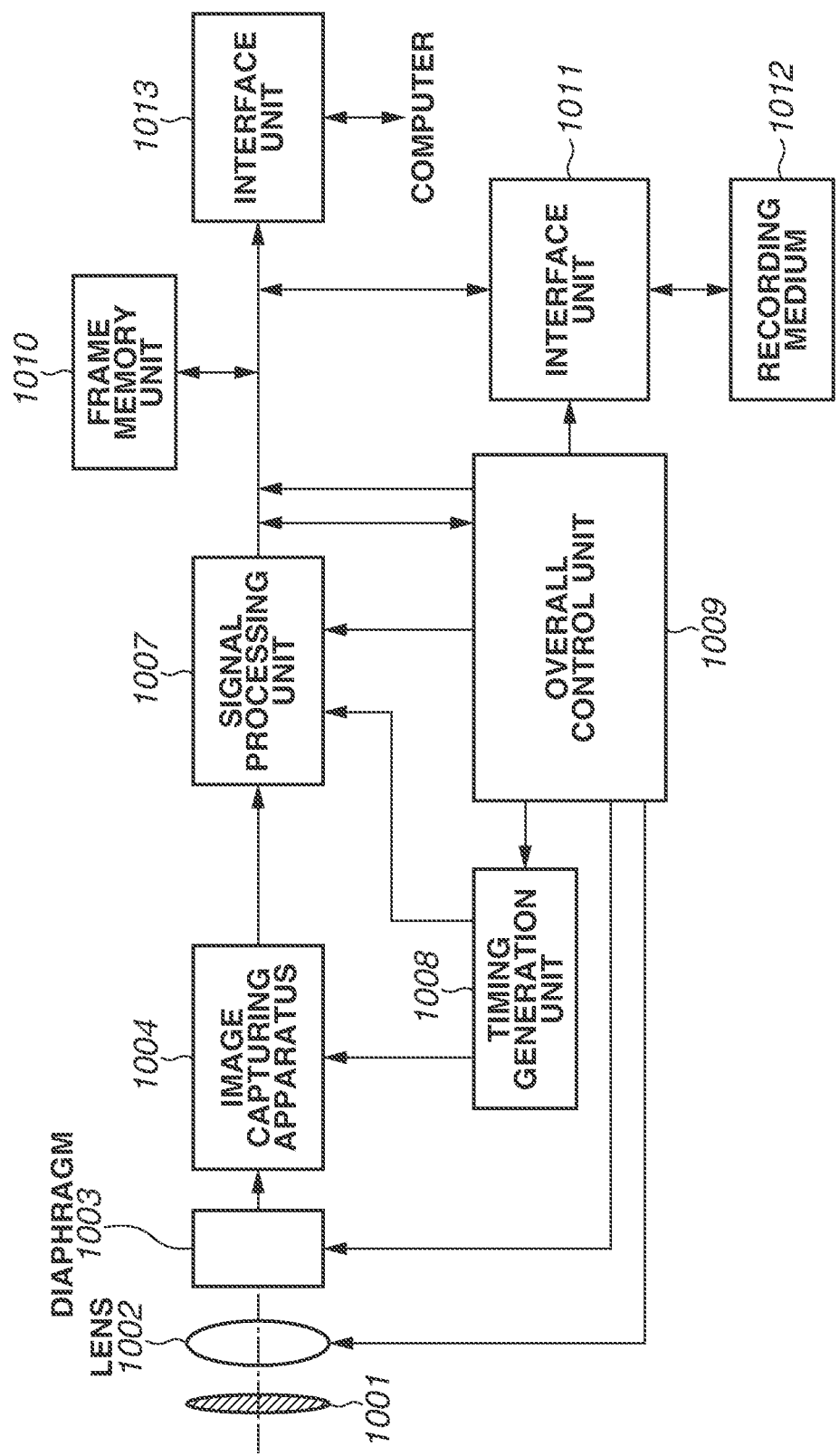
FIG. 11 is a block diagram illustrating an image capturing system according to an exemplary embodiment.

A third exemplary embodiment will be described. An image capturing system according to the exemplary embodiment will be described. Examples of the image capturing system include a digital camera, a digital camcorder, a camera head, a copy machine, a facsimile, a mobile phone, an in-vehicle camera, and an observation satellite. FIG. 11 is a block diagram illustrating a digital camera as an example of the image capturing system.

In FIG. 11, a barrier 1001 is a barrier for lens protection. A lens 1002 forms an optical image of a subject on an image capturing apparatus 1004. A diaphragm 1003 adjusts the quantity of light transmitted through the lens 1002. The image capturing apparatus 1004 is provided with the photoelectric conversion apparatus according to an above-described example or exemplary embodiment.

A signal processing unit 1007 performs processing such as correction and data compression on pixel signals output from the image capturing apparatus 1004 to acquire the image signals. Further, in FIG. 11, a timing generation unit 1008 outputs various timing signals to the image capturing apparatus 1004 and the signal processing unit 1007, and an overall control unit 1009 controls the whole system of the digital camera. A frame memory unit 1010 temporarily stores image data. An interface unit 1011 records to and reads from a recording medium 1012. The recording medium 1012 is a removable recording medium, such as a semiconductor memory, for recording and reading captured data. An interface unit 1013 communicates with an external computer.

The image capturing system may be composed of the image capturing apparatus 1004 and the signal processing unit 1007 for processing pixel signals output from the image capturing apparatus 1004. In this case, the other components are arranged outside the image capturing system.

As described above, the image capturing apparatus 1004 in the image capturing system according to the example constitutes the image capturing apparatus according to the first or second exemplary embodiment. This configuration offers a wider dynamic range of images acquired by the image capturing apparatus.

Figure 12A:
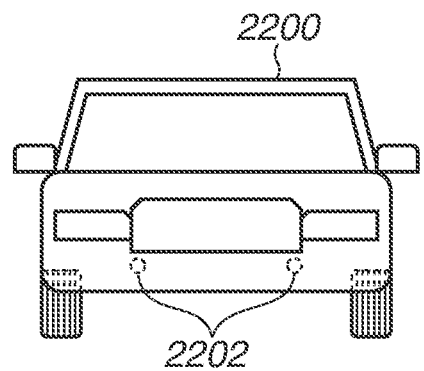
FIGS. 12A and 12B are block diagrams illustrating a moving object according to an exemplary embodiment.
Figure 12A:
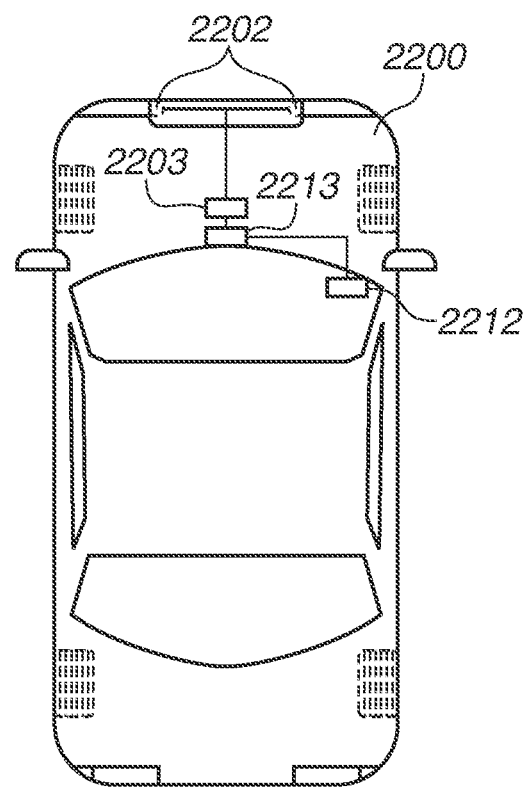
Figure 12A:
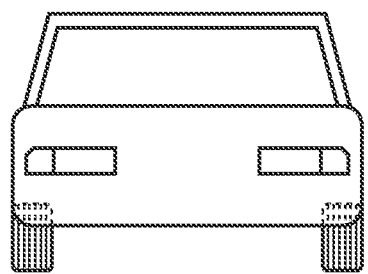

A fourth exemplary embodiment will be described. A moving object according to the exemplary embodiment will be described. The moving object according to the present exemplary embodiment is a vehicle including an in-vehicle camera. FIG. 12A schematically illustrates the exterior and the main internal structure of a vehicle 2200. The vehicle 2200 includes image capturing apparatuses 2202, an application-specific integrated circuit (ASIC) 2203 for an image capturing system, a warning apparatus 2212, and a main control unit 2213.

The image capturing apparatus 2202 is the image capturing apparatus according to an above-described example. The warning apparatus 2212 warns a driver in response to a reception of a signal indicating an abnormality from an image capturing system, a vehicle sensor, or a control unit. The main control unit 2213 generally controls the operations of the image capturing system, the vehicle sensor, and the control unit. No main control unit 2213 in the vehicle is applicable. In this case, the image capturing system, the vehicle sensor, and the control unit each include a communication interface to transmit and receive control signals via a communication network (e.g., Controller Area Network (CAN) standard).

Figure 12B:
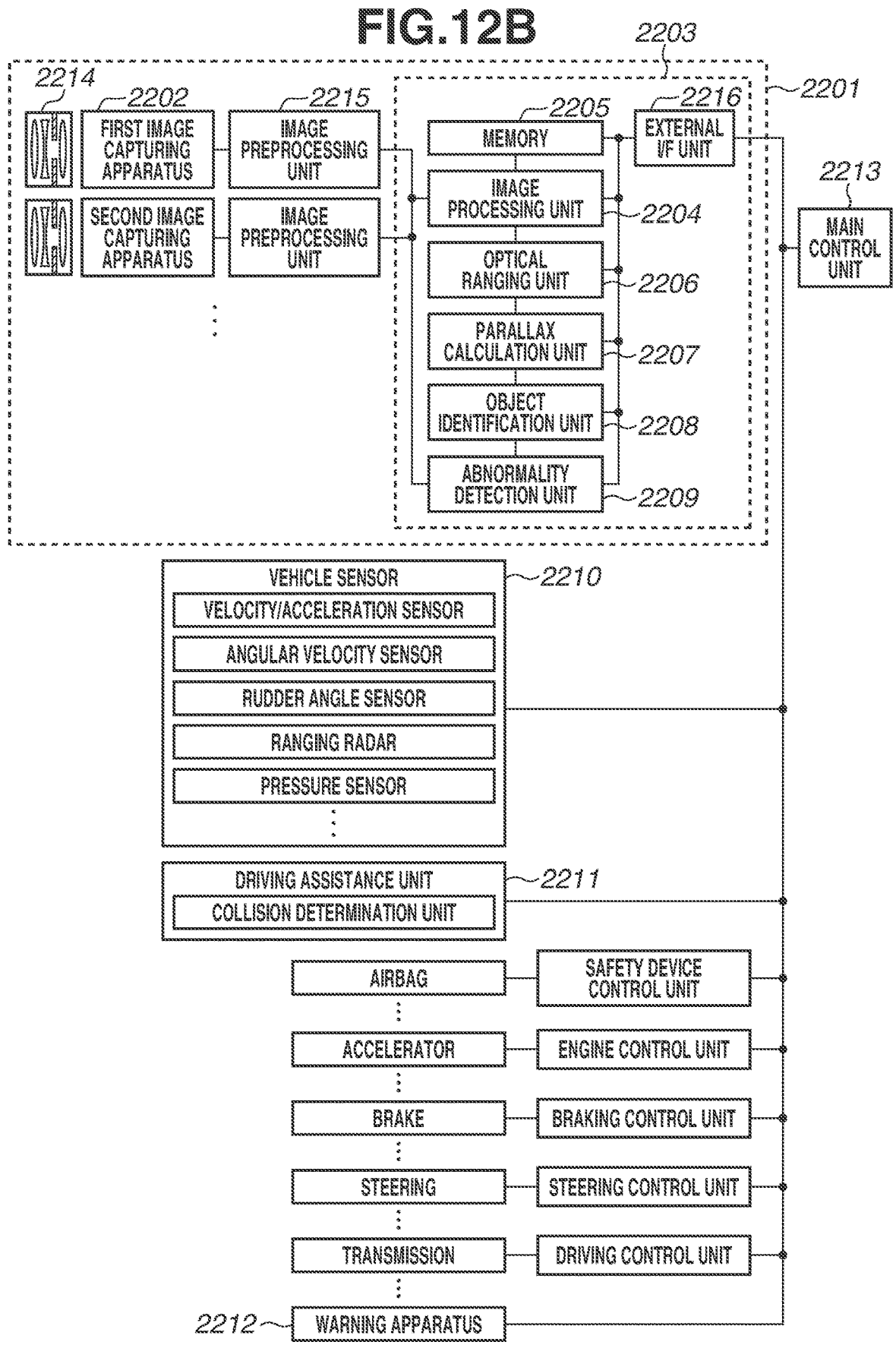

FIG. 12B is a block diagram illustrating a system configuration of the vehicle 2200. The vehicle 2200 includes a first image capturing apparatus 2202 and a second image capturing apparatus 2202. Specifically, the in-vehicle camera according to the present exemplary embodiment is a stereo camera. An optical unit 2214 forms a subject image on the image capturing apparatus 2202. The image capturing apparatus 2202 outputs pixel signals, which are to be processed by an image preprocessing unit 2215. The processed pixel signals are transmitted to the ASIC 2203. The image preprocessing unit 2215 performs processing such as signal-noise (S-N) calculation and the addition of a synchronization signal.

The ASIC 2203 includes an image processing unit 2204, a memory 2205, an optical ranging unit 2206, a parallax calculation unit 2207, an object identification unit 2208, an abnormality detection unit 2209, and an external interface (external I/F) unit 2216. The image processing unit 2204 processes pixel signals to generate image signals. Further, the image processing unit 2204 performs image signal correction and abnormal pixel complementation. The memory 2205 temporarily stores image signals. Further, the memory 2205 can store the locations of known abnormal pixels of the image capturing apparatus 2202. The optical ranging unit 2206 performs focusing on a subject or distance measurement using image signals. The parallax calculation unit 2207 performs subject matching (stereo matching) on a parallax image. The object identification unit 2208 analyzes image signals and identifies a subject such as a vehicle, a person, a sign, or a road. The abnormality detection unit 2209 detects a failure or malfunction of the image capturing apparatus 2202. If a failure or malfunction is detected, the abnormality detection unit 2209 transmits a signal indicating that an abnormality is detected to the main control unit 2213. The external I/F unit 2216 relays information between the components of the ASIC 2203 and the main control unit 2213 or various control units by transmission and reception.

The vehicle 2200 includes a vehicle information acquisition unit 2210 and a driving assistance unit 2211. The vehicle information acquisition unit 2210 includes vehicle sensors such as a velocity/acceleration sensor, an angular velocity sensor, a rudder angle sensor, a ranging radar, and a pressure sensor.

The driving assistance unit 2211 includes a collision determination unit. The collision determination unit determines whether a collision with an object is possible based on information from the optical ranging unit 2206, the parallax calculation unit 2207, and the object identification unit 2208. The optical ranging unit 2206 and the parallax calculation unit 2207 are an example of a distance information acquisition unit that acquires distance information about the distance to a target object. Specifically, the distance information is information about a parallax, the amount of defocus, and the distance to a target object. The collision determination unit can use any of the above-described distance information to determine the collision possibility. The distance information acquisition unit can be dedicated hardware or a software module.

While the example has been described of the driving assistance unit 2211's controlling the vehicle 2200 to prevent collision with another object, the control of automatic driving to follow another vehicle or to prevent the vehicle from running across a traffic lane is also applicable.

The vehicle 2200 further are provided with driving units for use in driving such as an airbag, an accelerator, a brake, a steering, and a transmission. The vehicle 2200 further includes control units for the driving units. Each control unit controls the corresponding driving unit based on control signals from the main control unit 2213.

The image capturing system used in the present exemplary embodiment is applicable to other moving objects (moving apparatuses) such as ships, aircraft, and industrial robots, other than vehicles. Furthermore, the image capturing system is applicable to equipment that widely uses object recognition, such as intelligent transportation systems (ITS), as well as moving objects.

As described above, the image capturing apparatus according to the first or second exemplary embodiment is used as the image capturing apparatus 2202 in the vehicle in the example. This configuration provides a wider dynamic range of images acquired from the image capturing apparatuses.

The disclosure provides a wider sensitivity difference between photodiodes, improving dynamic range characteristics.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-131484, filed Aug. 3, 2020, which is hereby incorporated by reference herein in its entirety.

What is claimed is:

1. An apparatus including a substrate on which a pixel with a microlens is formed,
   wherein the pixel includes a first conversion portion and a second conversion portion in an in-plane direction of the substrate,
   wherein the second conversion portion has a lower sensitivity to light than a sensitivity of the first conversion portion,
   wherein the first conversion portion and the second conversion portion have a nested structure in which one of the first conversion portion and the second conversion portion is at a peripheral portion of the pixel and the other one of the first conversion portion and the second conversion portion is at a central portion of the pixel,
   wherein, in a depth direction of the substrate, the apparatus includes a first member between the first conversion portion and the microlens and a second member between the second conversion portion and the microlens,
   wherein the first member is adjacent to the second member in the in-plane direction of the substrate, and
   wherein a refractive index of the first member is higher than a refractive index of the second member.

2. The apparatus according to claim 1, wherein an area of the first conversion portion is larger than an area of the second conversion portion.

3. The apparatus according to claim 1,
wherein the pixel includes a color filter, and
wherein, in the depth direction of the substrate, the first member is arranged between the first conversion portion and the color filter, and the second member is arranged between the second conversion portion and the color filter.

4. The apparatus according to claim 1, wherein the first member and the second member contain two or more of Si, N, O, H, C, and S.

5. The apparatus according to claim 1, wherein the pixel includes a plurality of layered semiconductor substrates including a first substrate and a circuit substrate including a circuit, the first substrate including the first conversion portion and the second conversion portion.

6. The apparatus according to claim 1, wherein the pixel is a back-side illumination complementary metal oxide semiconductor (CMOS) sensor.

7. A system comprising:
the apparatus according to claim 1; and
a processing apparatus configured to process a signal output from the apparatus.

8. A digital camera comprising:
the system according to claim 7; and
a lens that forms a subject image on the apparatus.

9. A moving object comprising:
the apparatus according to claim 1;
a processing apparatus configured to process a signal output from the apparatus; and
a control unit configured to control the moving object based on a result of the processing.

10. An apparatus including a substrate including a pixel,
wherein the pixel includes a first conversion portion and a second conversion portion in an in-plane direction of the substrate, the second conversion portion having a lower sensitivity to light than a sensitivity of the first conversion portion,
wherein the first conversion portion and the second conversion portion have a nested structure in which one of the first conversion portion and the second conversion portion is at a peripheral portion of the pixel and the other one of the first conversion portion and the second conversion portion is at a central portion of the pixel,
wherein the apparatus includes an overflow transistor to discharge excessive charge of the first conversion portion,
wherein, in a depth direction of the substrate, the apparatus includes a first member located nearer a light incidence side than a side facing the light incidence side of the first conversion portion and a second member located nearer a light incidence side than a side facing the light incidence side of the second conversion portion,
wherein the first member is adjacent to the second member in the in-plane direction of the substrate, and
wherein a refractive index of the first member is higher than a refractive index of the second member.

11. The apparatus according to claim 10, wherein an area of the first conversion portion is larger than an area of the second conversion portion.

12. The apparatus according to claim 10,
wherein the pixel includes one or more microlenses, and
wherein the first conversion portion, the second conversion portion, the first member, and the second member are arranged under the one or more microlenses.

13. An apparatus including a substrate including a pixel,
wherein the pixel includes a first conversion portion of a first conductivity type and a second conversion portion of the first conductivity type having a lower impurity concentration than an impurity concentration in the first conversion portion of the first conductivity type, the first conversion portion and the second conversion portion being in an in-plane direction of the substrate,
wherein the first conversion portion and the second conversion portion have a nested structure in which one of the first conversion portion and the second conversion portion is at a peripheral portion of the pixel and the other one of the first conversion portion and the second conversion portion is at a central portion of the pixel,
wherein, in a depth direction of the substrate, a first member is located nearer a light incidence side than a side facing the light incidence side of the first conversion portion,
wherein, in the depth direction of the substrate, a second member is located nearer a light incidence side than a side facing the light incidence side of the second conversion portion,
wherein the first member is adjacent to the second member in the in-plane direction of the substrate, and
wherein a refractive index of the first member is higher than a refractive index of the second member.

14. The apparatus according to claim 13,
wherein the pixel includes one or more microlenses, and
wherein the first conversion portion, the second conversion portion, the first member, and the second member are arranged under the one or more microlenses.

15. An apparatus including a substrate on which a pixel with a microlens is formed,
wherein the pixel includes a first conversion portion and a second conversion portion in an in-plane direction of the substrate, the second conversion portion having a lower sensitivity to light than a sensitivity of the first conversion portion,
wherein the first conversion portion and the second conversion portion have a nested structure in which one of the first conversion portion and the second conversion portion is at a peripheral portion of the pixel and the other one of the first conversion portion and the second conversion portion is at a central portion of the pixel,
wherein the first conversion portion and the second conversion portion are in a first plane parallel to a light incidence surface of the substrate,
wherein a first member overlapping the first conversion portion and a second member overlapping the second conversion portion are adjacent to each other in a second plane parallel to the light incidence surface of the substrate,
wherein the first member and the second member are arranged under the microlens, and
wherein a refractive index of the first member is higher than a refractive index of the second member.

16. The apparatus according to claim 15, wherein a distance from the light incidence surface to the second plane is shorter than or equal to 300 nm.

17. The apparatus according to claim 15,
wherein the pixel includes a color filter, and
wherein, in the depth direction of the substrate, the first member is arranged between the first conversion portion and the color filter, and the second member is arranged between the second conversion portion and the color filter.

18. A method comprising:
forming a first semiconductor region and a second semiconductor region, the first semiconductor region constituting a conversion portion; and
forming a first member between a light incidence surface side of the first semiconductor region and a part of a microlens and a second member between a light incidence surface side of the second semiconductor region and a part of the microlens,
wherein the first conversion portion and the second conversion portion have a nested structure in which one of the first conversion portion and the second conversion portion is at a peripheral portion of the pixel and the other one of the first conversion portion and the second conversion portion is at a central portion of the pixel,
wherein the first member and the second member are adjacent to each other, and
wherein a refractive index of the first member and a refractive index of the second member are different from each other.

19. The method according to claim 18, wherein the forming of the second member includes:
removing a part of the first member; and
disposing a material of the second member in a groove portion formed by the removing.

* * * * *